(12) United States Patent
Dainese et al.

(10) Patent No.: US 11,610,986 B2
(45) Date of Patent: Mar. 21, 2023

(54) POWER SEMICONDUCTOR SWITCH HAVING A CROSS-TRENCH STRUCTURE

(71) Applicants: Infineon Technologies AG, Neubiberg (DE); Infineon Technologies Dresden GmbH & Co. KG, Dresden (DE)

(72) Inventors: Matteo Dainese, Munich (DE); Alexander Philippou, Munich (DE); Markus Beninger-Bina, Grosshelfendorf (DE); Ingo Dirnstorfer, Dresden (DE); Erich Griebl, Dorfen (DE); Christian Jaeger, Munich (DE); Johannes Georg Laven, Taufkirchen (DE); Caspar Leendertz, Munich (DE); Frank Dieter Pfirsch, Munich (DE)

(73) Assignees: Infineon Technologies AG, Neubiberg (DE); Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 17/350,505

(22) Filed: Jun. 17, 2021

(65) Prior Publication Data
US 2021/0313460 A1    Oct. 7, 2021

Related U.S. Application Data

(60) Division of application No. 16/409,454, filed on May 10, 2019, now Pat. No. 11,075,290, which is a (Continued)

(30) Foreign Application Priority Data

May 29, 2017   (DE) .......................... 102017111595.1

(51) Int. Cl.
*H01L 29/00*   (2006.01)
*H01L 29/739*  (2006.01)
(Continued)

(52) U.S. Cl.
CPC ...... *H01L 29/7397* (2013.01); *H01L 29/0619* (2013.01); *H01L 29/0649* (2013.01); (Continued)

(58) Field of Classification Search
CPC .......... H01L 29/66348; H01L 29/4236; H01L 29/7937; H01L 29/0607; H01L 29/0619; (Continued)

(56) References Cited

U.S. PATENT DOCUMENTS

| | | |
|---|---|---|
| 9,111,990 B1 | 8/2015 | Kamata |
| 10,304,952 B2 | 5/2019 | Dainese et al. |
| 2005/0280078 A1 | 12/2005 | Teramae et al. |

(Continued)

FOREIGN PATENT DOCUMENTS

| | | |
|---|---|---|
| CN | 104733519 A | 6/2015 |
| CN | 104867925 A | 8/2015 |

(Continued)

*Primary Examiner* — Reema Patel
(74) *Attorney, Agent, or Firm* — Murphy, Bilak & Homiller, PLLC

(57) ABSTRACT

A power semiconductor switch includes an active cell region with a drift region, an edge termination region, and IGBT cells within the active cell region. Each IGBT cell includes trenches that extend into the drift region and laterally confine mesas. At least one control trench has a control electrode for controlling the load current. At least one dummy trench has a dummy electrode electrically coupled to the control electrode. At least one further trench has a further trench electrode. At least one active mesa is electrically connected to a first load terminal within the active cell region. Each control trench is arranged adjacent to no more than one active mesa. At least one inactive mesa is adjacent to the dummy trench. A cross-trench structure merges each control trench, dummy trench and further trench to each other. The cross-trench structure overlaps at least partially along a vertical direction with the trenches.

16 Claims, 25 Drawing Sheets

Related U.S. Application Data continuation of application No. 15/989,778, filed on May 25, 2018, now Pat. No. 10,304,952.

(51) Int. Cl.
| | |
|---|---|
| *H01L 29/06* | (2006.01) |
| *H01L 29/10* | (2006.01) |
| *H01L 29/40* | (2006.01) |
| *H01L 29/66* | (2006.01) |
| *H01L 29/423* | (2006.01) |

(52) U.S. Cl.
CPC ...... *H01L 29/0657* (2013.01); *H01L 29/0696* (2013.01); *H01L 29/1095* (2013.01); *H01L 29/404* (2013.01); *H01L 29/407* (2013.01); *H01L 29/4236* (2013.01); *H01L 29/66348* (2013.01); *H01L 29/7396* (2013.01); *H01L 29/0638* (2013.01)

(58) Field of Classification Search
CPC ............. H01L 29/0638; H01L 29/0649; H01L 29/0657; H01L 29/0696; H01L 29/1095
See application file for complete search history.

(56) References Cited

U.S. PATENT DOCUMENTS

| | | |
|---|---|---|
| 2015/0236143 A1 | 8/2015 | Pfirsch et al. |
| 2018/0083101 A1 | 3/2018 | Kudo et al. |

FOREIGN PATENT DOCUMENTS

| | | |
|---|---|---|
| CN | 105448949 A | 3/2016 |
| DE | 102014114228 A1 | 4/2015 |
| DE | 102015107319 A1 | 11/2015 |
| DE | 102015107331 A1 | 11/2015 |
| JP | 2006005248 A | 1/2006 |
| JP | 2007266570 A | 10/2007 |
| JP | 2015156489 A | 8/2015 |
| WO | 2017029719 A1 | 2/2017 |

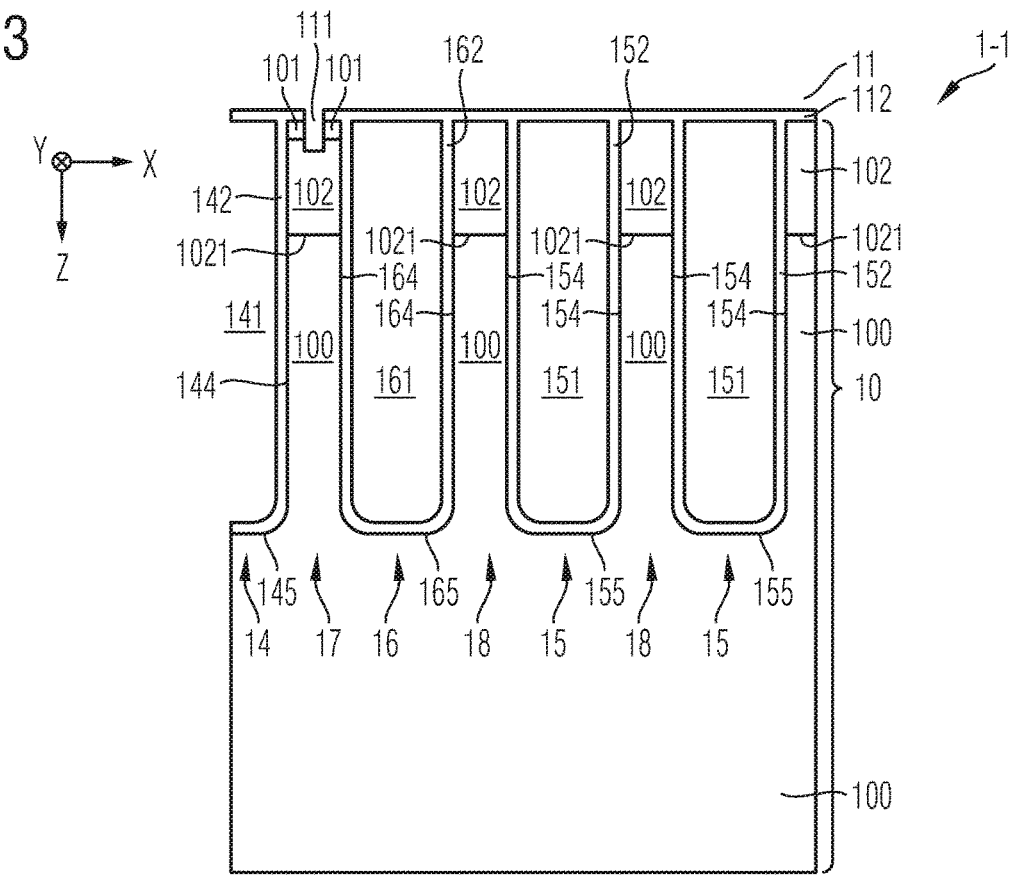
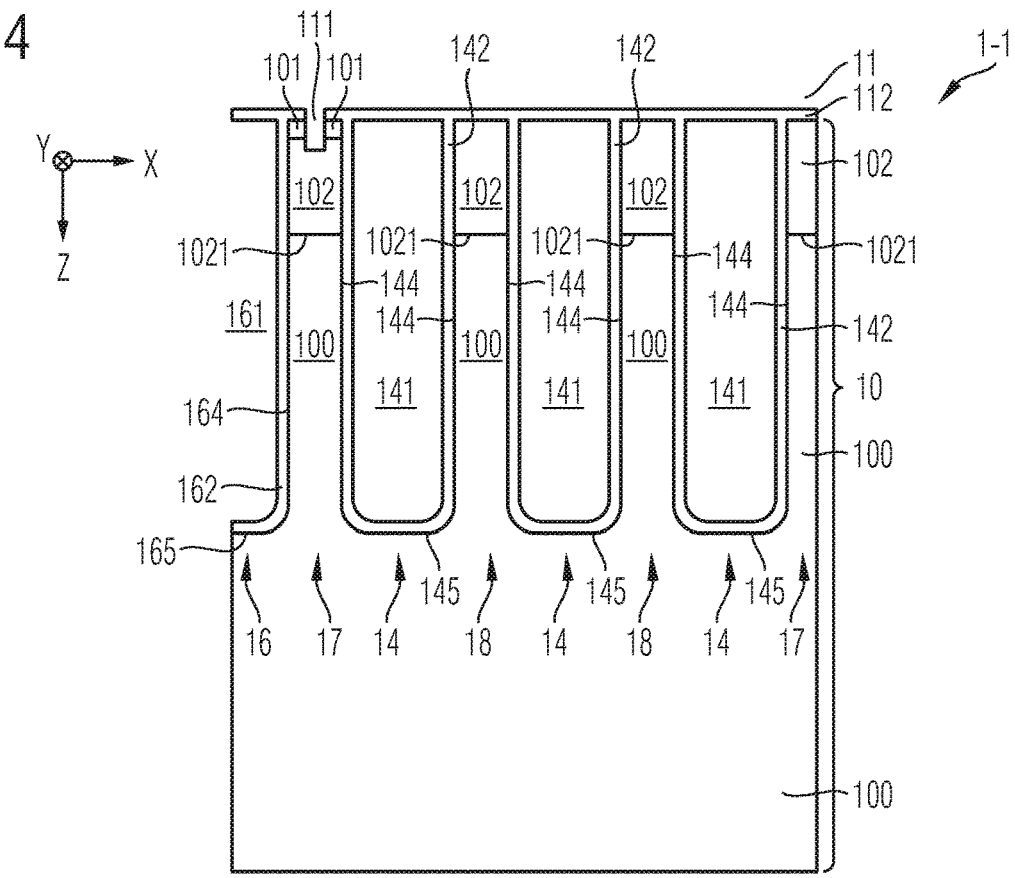

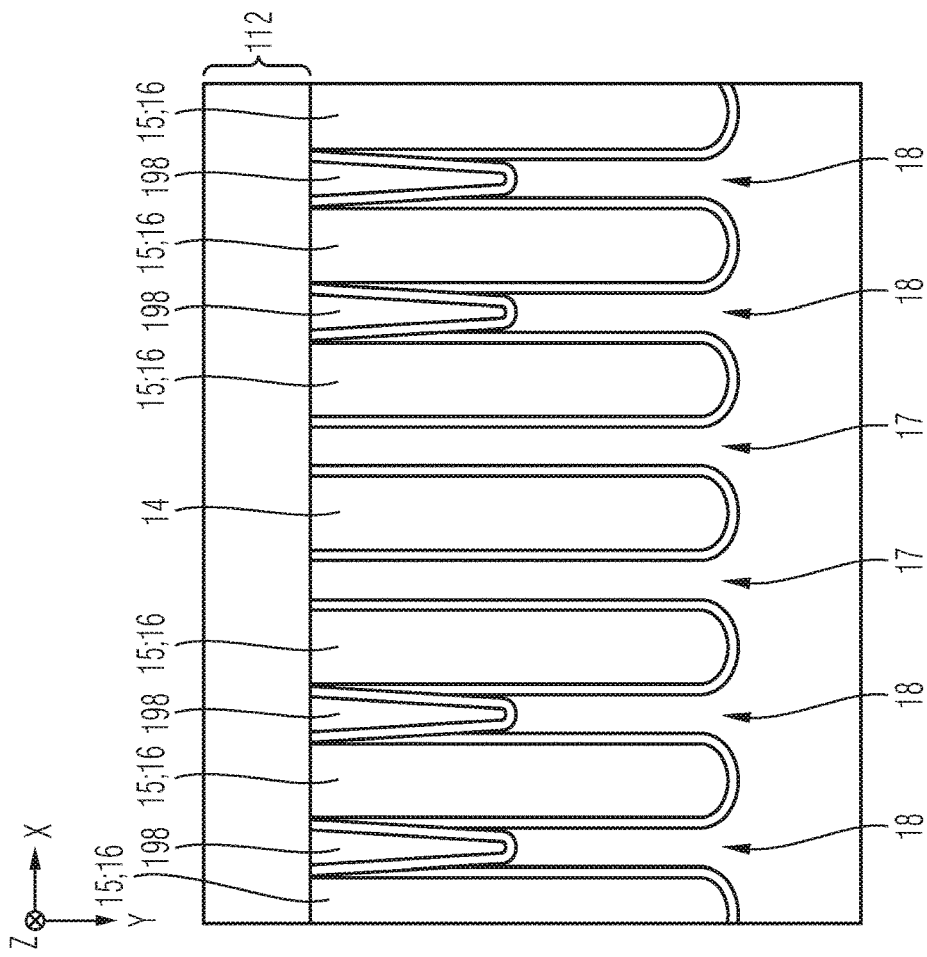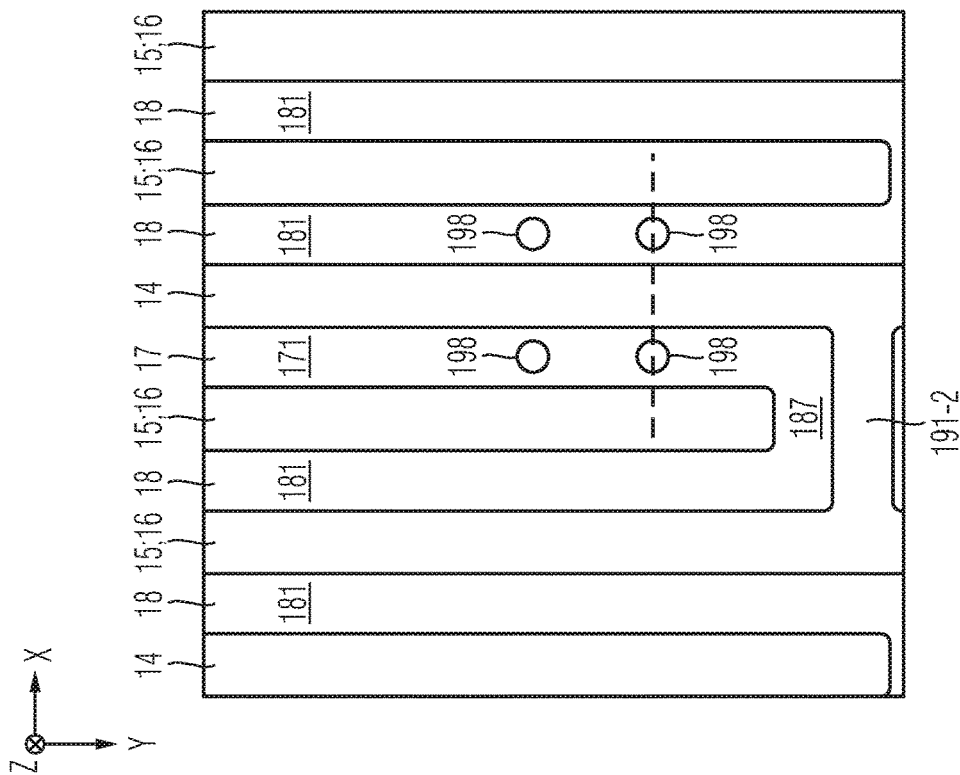

ated separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

POWER SEMICONDUCTOR SWITCH HAVING A CROSS-TRENCH STRUCTURE

TECHNICAL FIELD

This specification refers to embodiments of a power semiconductor device and to embodiments of a method of processing a power semiconductor device. In particular, this specification is directed to embodiments of a power semiconductor device having one or more power cells that each comprise at least three trenches with respective trench electrodes, e.g., for dV/dt controllability, and to corresponding processing methods.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

In some cases, the gate electrode may be included within a trench of the power semiconductor device, wherein the trench may exhibit, e.g., a stripe configuration or a needle configuration.

Further, such trench occasionally includes more than only one electrode, e.g., two or more electrodes that are arranged separately from each other and sometimes also electrically insulated from each other. For example, a trench may comprise both a gate electrode and a field electrode, wherein the gate electrode can be electrically insulated from each of the load terminals, and wherein the field electrode can be electrically connected to one of the load terminals.

It is usually desirable to keep losses, e.g., switching losses, of the power semiconductor device low.

For example, low switching losses may be achieved by ensuring short switching durations, e.g., a short turn-on duration and/or a short turn-off duration.

On the other hand, in a given application, there may also be requirements regarding a maximum slope of the voltage (dV/dt) and/or a maximum slope of the load current (dI/dt).

SUMMARY

According to an embodiment, a power semiconductor device comprises an active region configured to conduct a load current; an inactive termination region surrounding the active region; a semiconductor body that forms a part of each of the active region and the inactive termination region; a first load terminal and a second load terminal, wherein the active region is configured to conduct the load current between first load terminal and the second load terminal; a control terminal configured to receive a control signal for controlling the load current; at least one power cell with a plurality of trenches extending into the semiconductor body and arranged adjacent to each other along a first lateral direction. Each of the plurality of trenches includes a trench electrode. Each of the trenches has a stripe configuration that extends along a second lateral direction into the active region. The plurality of trenches of each of the at least one power cell comprises at least one first type trench whose trench electrode is electrically connected to the control terminal, and at least one second type trench whose trench electrode is either electrically connected to an electrical potential different from the electrical potential of the control terminal or electrically floating. The trenches spatially confine a plurality of mesas. The plurality of mesas comprise at least one first type mesa electrically connected to the first load terminal within the active region and being configured to conduct at least a part of the load current, and at least one second type mesa configured to not conduct the load current. The device further comprises a decoupling structure being arranged within at least one of said at least one second type mesa and separating said at least one second type mesa into a first section formed at least by the semiconductor body in the active region and into a second section formed at least by the semiconductor body in the termination region.

According to another embodiment, a method comprises providing a power semiconductor device that comprises: an active region configured to conduct a load current; an inactive termination region surrounding the active region; a semiconductor body that forms a part of each of the active region and the inactive termination region; a first load terminal and a second load terminal, wherein the active region is configured to conduct the load current between first load terminal and the second load terminal; a control terminal configured to receive a control signal for controlling the load current; at least one power cell with a plurality of trenches extending into the semiconductor body and arranged adjacent to each other along a first lateral direction. Each of the plurality of trenches includes a trench electrode. Each of the trenches has a stripe configuration that extends along a second lateral direction into the active region. The plurality of trenches of each of the at least one power cell comprises at least one first type trench whose trench electrode is electrically connected to the control terminal, and at least one second type trench whose trench electrode is either electrically connected to an electrical potential different from the electrical potential of the control terminal or electrically floating. The trenches spatially confine a plurality of mesas. The plurality of mesas comprise at least one first type mesa electrically connected to the first load terminal within the active region and being configured to conduct at least a part of the load current, and at least one second type mesa configured to not conduct the load current. The method further comprises providing a decoupling structure that is arranged within at least one of said at least one second type mesa and that separates the at least one second type mesa into a first section formed at least by the semiconductor body in the active region and into a second section formed at least by the semiconductor body in the termination region.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIGS. 2-4 each schematically and exemplarily illustrate a section of a vertical cross-section of a power semiconductor device in accordance with one or more embodiments;

FIGS. 19A-19B schematically and exemplarily illustrate a section of a horizontal projection and a section of a vertical cross-section of a power semiconductor device in accordance with one or more embodiments;

DETAILED DESCRIPTION

Figure 1:
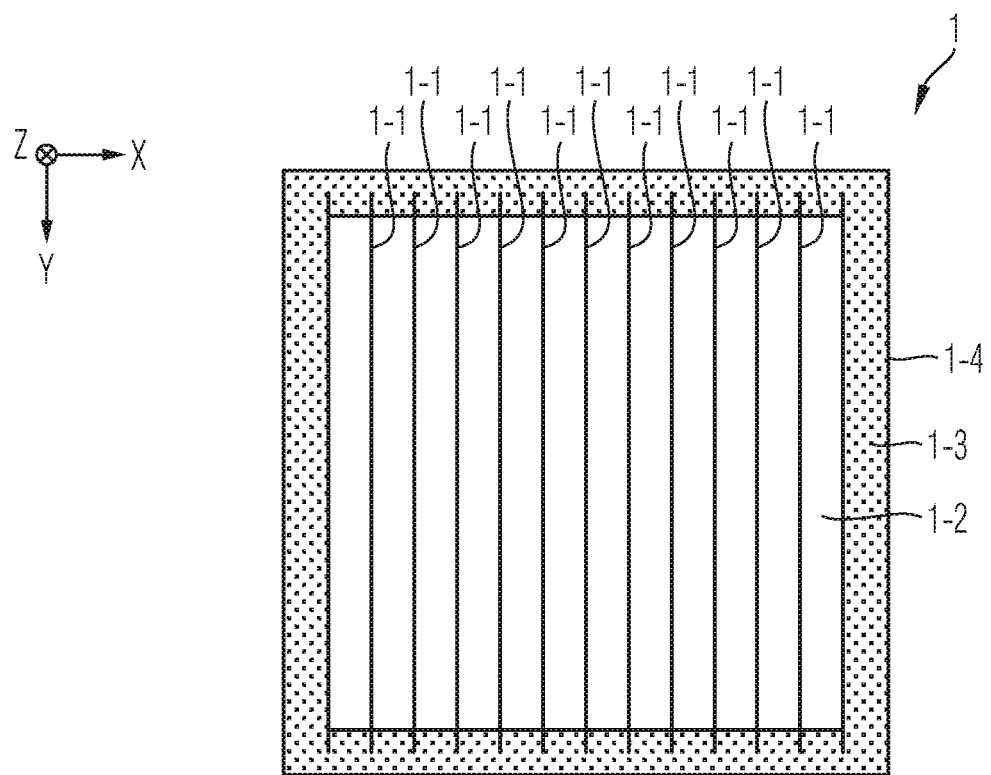
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V.

For example, the power semiconductor device described below may be a semiconductor device exhibiting a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

Figure 2:
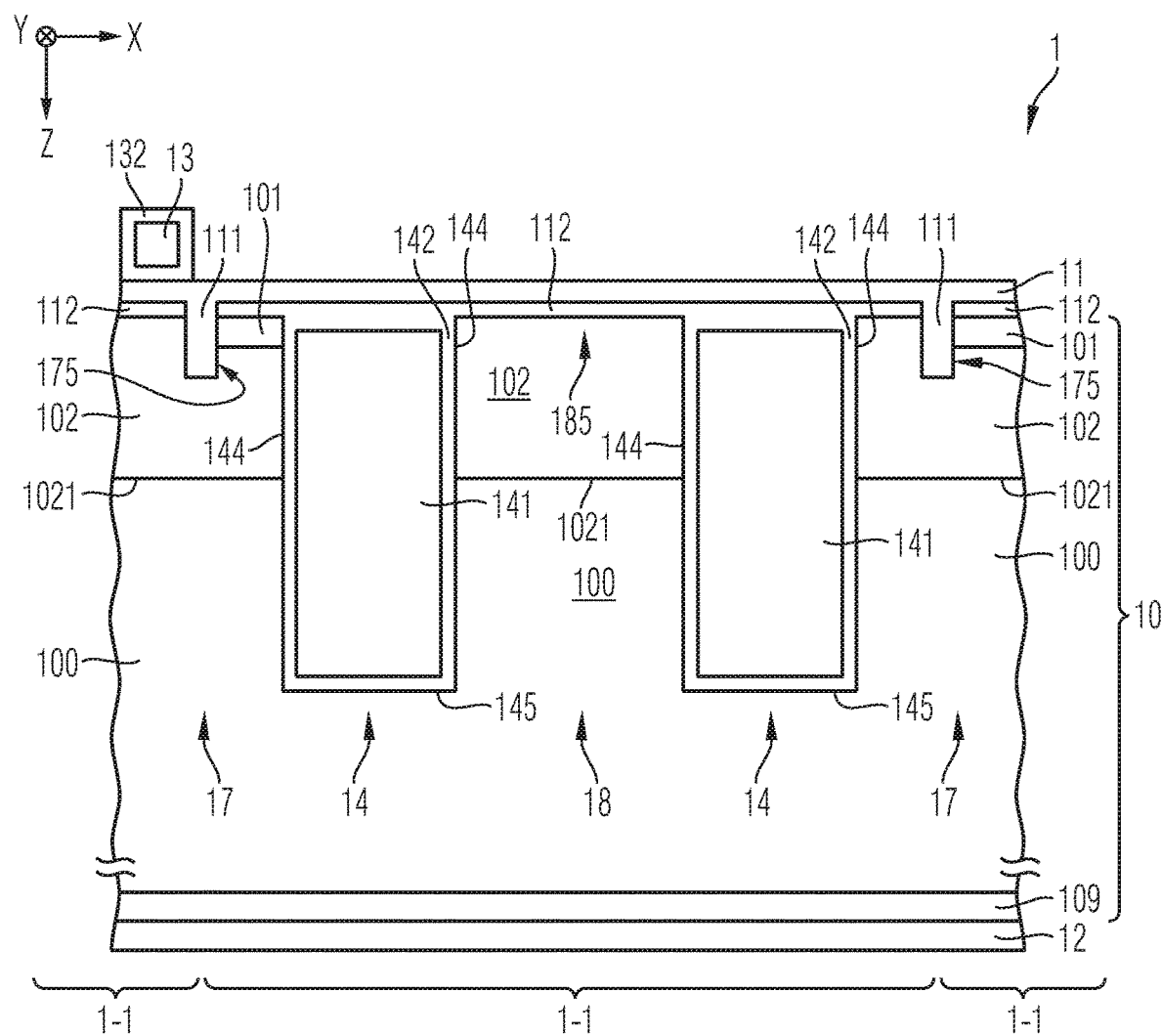

FIG. 1 schematically and exemplarily illustrates a section of a horizontal projection of a power semiconductor device 1 in accordance with one or more embodiments. Each of FIGS. 2-4 schematically and exemplarily illustrates a section of a vertical cross-section of an embodiment of the power semiconductor device 1 in accordance with one or more embodiments. In the following, it will be referred to each of FIGS. 1-4.

For example, the power semiconductor device 1 comprises a semiconductor body 10 that is coupled to a first load terminal 11 and a second load terminal 12.

Regarding all embodiments disclosed herein, the power semiconductor device 1 may be an IGBT. For example, each of FIGS. 1 to 17 shows aspects of a power semiconductor device that may be implemented so as to realize an IGBT.

For example, the first load terminal 11 is an emitter terminal, and the second load terminal 12 can be a collector terminal.

The semiconductor body 10 may comprise a drift region 100 with dopants of the first conductivity type. For example, the extension of the drift region 100 along the extension direction Z and its dopant concentration are chosen in dependence of the blocking voltage rating for which the power semiconductor device 1 shall be designed, e.g., in a manner as it is known to the skilled person.

Further, the first load terminal 11 may be arranged on the frontside of the power semiconductor device 1 and may include a frontside metallization. The second load terminal 12 may be arranged, opposite to the frontside, e.g., on a backside of the power semiconductor device 1 and may include, for example, a backside metallization. Accordingly, the power semiconductor device 1 may exhibit a vertical configuration. In another embodiment, each of the first load terminal 11 and the second load terminal 12 may be arranged on a common side, e.g., both on the frontside, of the power semiconductor device 1.

The power semiconductor device 1 may further include an active region 1-2, an inactive termination structure 1-3 (dotted area in FIG. 1; herein also referred to as "termination region") and a chip edge 1-4. The semiconductor body 10 may form a part of each of the active region 1-2 and the inactive termination region, wherein chip edge 1-4 may laterally terminate the semiconductor body 10. The chip edge 1-4 may have become into being by means of wafer dicing, for example, and may extend along the vertical direction Z. The inactive termination structure 1-3 may be arranged between the active region 1-2 and the chip edge 1-4, as illustrated in FIG. 1.

In the present specification, the terms "active region" and "termination structure" are employed in a common manner, i.e., the active region 1-2 and the termination structure 1-3 may be configured to provide for the principle technical functionalities typically associated therewith. For example, the active region 1-2 of the power semiconductor device 1 is configured to conduct a load current between the terminals 11, 12, whereas the termination structure 1-3 does not conduct the load current, but rather fulfills functions regarding the course of the electric field, ensuring the blocking capability, safely terminating the active region 1-2 and so forth, in accordance with an embodiment. For example, the termination structure 1-3 may entirely surround the active region 1-2, as illustrated in FIG. 1.

The active region 1-2 may comprise at least one power cell 1-1. In an embodiment, there are included a plurality of such power cells 1-1 within the active region 1-2. The number of power cells 1-1 may be greater than 100, than 1000, or even greater than 10,000. The power cells 1-1 may each exhibit an identical configuration. Thus, in an embodiment, each power cell 1-1 may exhibit a configuration of a power unit cell, e.g., as illustrated in FIGS. 2-17. In the following, when an explanation is presented for an exemplary configuration of a specific power cell 1-1 (e.g., like "the power cell 1-1 comprises . . . " or "the component of the power cell 1-1 is/has . . . "), this explanation may equally apply to all power cells 1-1 that may be included in the power semiconductor device 1, if not explicitly state otherwise.

Each power cell 1-1 may exhibit a stripe configuration as schematically illustrated in FIG. 1, wherein the total lateral extension in one lateral direction, e.g., along with the second lateral direction Y, of each power cell 1-1 and its components may substantially greater than the total lateral extension in the other lateral direction, e.g., along the first lateral direction X. For example, the longer total lateral extension in the second lateral direction Y of a respective stripe power cell 1-1 may be even greater than the total extension of the active region 1-2 along this lateral direction, as illustrated in FIG. 1.

In another embodiment, each power cell 1-1 may exhibit a cellular configuration, wherein the lateral extensions of each power cell 1-1 may be substantially smaller than the total lateral extensions of the active region 1-2. However, the present disclosure rather relates to embodiments of the power semiconductor device 1 in which the power cells 1-1 have a stripe configuration.

Referring to all embodiments disclosed herein, each of the power cells 1-1 may exhibit a stripe configuration and can be configured to provide for an IGBT functionality.

Each power cell 1-1 may extend at least partially into the semiconductor body 10 and comprise at least a section of the drift region 100. Further, each power cell 1-1 may be electrically connected with the first load terminal 11. Each power cell 1-1 may be configured to conduct a part of the load current between said terminals 11 and 12, and to block a blocking voltage applied between said terminals 11 and 12.

For controlling the power semiconductor device 1, each power cell 1-1 may be operatively coupled to or, respectively, comprise a control electrode configured to selectively set the respective power cell 1-1 into one of a conducting state and a blocking state.

For example, referring to the examples illustrated in FIGS. 2-4, a source region 101 may be electrically connected with the first load terminal 11 and may comprise dopants of the first conductivity type, e.g., at a significantly greater dopant concentration as the drift region 100. Further, a channel region 102 may be provided that comprises dopants of the second conductivity type and that separates the source region 101 and the drift region 100, e.g., that isolates the source region 101 from the drift region 100. A transition between the channel region 102 and the drift region 100 may form a pn-junction 1021. The drift region 100 may extend along the vertical direction Z until it interfaces with a doped contact region 109 that is arranged in electrical contact with the second load terminal 12. The doped contact region 109 may be formed in accordance with the configuration of the power semiconductor device 1; e.g., the doped contact region 109 can be an emitter region with dopants of the second conductivity type, e.g. a p-type emitter region 109. For forming an RC-IGBT, the doped contact region 109 may be constituted by an emitter region with dopants of the second conductivity type and by small sections with dopants of the first conductivity type that are also electrically connected to the second load terminal 12 in which are commonly referred to as "n-shorts". In between the doped contact region 109, there may also be provided a field stop region (not illustrated) that couples the drift region 100 to the doped contact region 109. For example, such field stop region may comprise dopants of the first conductivity type at a dopant concentration significantly greater than the dopant concentration of the drift region.

For example, each power cell 1-1 includes a plurality of trenches 14, 15, 16 that extend into the semiconductor body 10 and that are arranged adjacent to each other along the first lateral direction X, wherein each of the trenches 14, 15, 16 has a stripe configuration that extends along the second lateral direction Y into the active region 1-2 and optionally also further into the termination region 1-3, and wherein the trenches 14, 15, 16 spatially confine a plurality of mesas 17, 18.

Each of the plurality of trenches 14, 15, 16 may include a trench electrode 141, 151, 161. For example, each of the trench electrodes 141, 151, 161 may also extend along the second lateral direction Y into the active region 1-2 and optionally also further into the termination region 1-3. Accordingly, also each of the mesas 17, 18 spatially confined by the trenches 14, 15, 16 may extend along the second lateral direction Y into the active region 1-2 and optionally also further into the termination region 1-3. With respect to FIG. 1, it shall be understood that even though the trenches 14, 15, 16 may extend into each of the active region 1-2 and the termination region 1-3, the power cells 1-1 fulfill their functionality of conducting the major part of the load current (e.g., greater 90%) only in the active region 1-2, in accordance with an embodiment of the power semiconductor device 1.

The trench electrodes 141, 151, 161 may be electrically insulated from the semiconductor body 10 by means of a respective trench insulator 142, 152, 162. In the lateral direction, e.g., in the first lateral direction X, the trenches 14, 15, 16 may be terminated by respective trench side walls 144, 154, 164, and in the vertical direction Z, the trenches 14, 15, 16 may be terminated by respective trench bottom 145, 155, 165.

As used herein, the term "mesa" may designate a section of the semiconductor body 10 that extends between two trench sidewalls of two adjacent trenches facing to each other and that has substantially the same total extension in the vertical direction Z as said two adjacent trenches.

In an embodiment, the power semiconductor device 1 may comprise a control terminal 13, wherein the semiconductor body 10 can be configured to conduct the load current between first load terminal 11 and the second load terminal 12, e.g., by means of the power cells 1-1, and wherein the control terminal 13 can be configured to receive a control signal for controlling the load current. Such control signal can be provided by a driver (not illustrated), for example. The control terminal 13 may be electrically insulated from the first load terminal 11 and the second load terminal 12, e.g., by means of an insulation structure 132. In an embodiment, the control terminal 13 is a gate terminal. For example, the power semiconductor device 1 is an IGBT that is configured to be controlled based on a gate-emitter-voltage $V_{GE}$, e.g., in a principle manner of controlling an IGBT known to the skilled person, wherein the gate-emitter-voltage, i.e., a voltage between the first load terminal 11 and the control terminal 13, can be provided by the driver.

For example, the plurality of trenches comprises at least one first type trench 14 whose trench electrode 141 is electrically connected to the control terminal 13. Further, the plurality of mesas may comprise at least one first type mesa 17 that is electrically connected to the first load terminal 11 within the active region 1-2 and that is configured to conduct at least a part of the load current.

For example, the first type trench 14 spatially confines, at least on one side, the first type mesa 17. Then, the first type trench 14 can be a control trench and its trench electrode as a gate electrode that is configured to control the load current, e.g., by means of inducing an inversion channel in the channel region 102.

For example, the first type mesa 17 comprises the source region 101 and the channel region 102, wherein these regions 101 and 102 may be electrically connected to the first load terminal 11 by means of a first contact plug 111. A transition 175 between the first load terminal 11 and the first type mesa 17 may provide for an interface for the load current to pass from the first load terminal 11 into the semiconductor body 10 and/or vice versa.

The transition 175 between the first type mesa 17 and the first load terminal 11 may be electrically conductive due to the first contact plug 111. For example, the first contact plug 111 penetrates an insulation layer 112 that in section where it is not penetrated by the plug 11 isolates the semiconductor body 10 from the first load terminal 11. The first contact plug 111 may extend in the first type mesa 17 so as to contact each of the source region 101 and the channel region 102. However, it shall be understood that the first contact plug 111 may, but must not necessarily, extend into the semiconductor portion of the first type mesa 17 for establishing the electrical connection thereto. For example, the first contact plug 111 may terminate substantially at the surface of the semiconductor body 10 and may still establish contact to both the source region 101 and the channel region 102. In another embodiment, as illustrated, the first contact plug 111 extends along the vertical direction Z into the semiconductor portion of the first type mesa 17.

For example, the first contact plug 111 is arranged at a lateral central position with respect to the mesa extension in the first lateral direction X. Further, it shall be understood that the source region 101 may be arranged on both sides of the contact plug, e.g., in a symmetrical manner, as illustrated in FIGS. 3 and 4, or only arranged adjacent to one of the sides of the first contact plug 111, e.g., on that side that is closest to the first type trench 14 that controls the load current in the first type mesa 17, as illustrated in FIG. 2 and also in each of (cf. fields 116) FIG. 5B, FIGS. 10, 11, 12, 13, 14A, 15 and 24).

Hence, in accordance with an embodiment, the first type mesa 17 includes the source region 101 only adjacent to one side of the first contact plug 111; e.g., the first type mesa 17 can include an active mesa portion (right side in FIG. 2) and an inactive mesa portion (left to the first contact plug 111). Depending on the process, such "split" first type mesa 17 may yield improved reliability of the device 1.

For example, an inversion channel may be induced only in the active portion of the first type mesa 17, but not in the inactive portion of the first type mesa 17.

E.g., the description of the second type mesa 18 given in more detail below may analogously apply to the inactive portion of the first type mesa 17.

Hence, in an embodiment, the first type mesa 17 is separated, along the first lateral direction X, into the active mesa portion and the inactive mesa portion. Such separation may for example be achieved by correspondingly structuring the source region 101 (cf. fields 116 in the drawings). For example, the active mesa portion is arranged adjacent to the first type trench 14 (implemented as control trench), and the inactive mesa portion is arranged adjacent to the second type trench 16.

E.g., as will become more apparent from the following description, each of the embodiments illustrated in FIGS. 5B, 10, 11, 12, 13, 14A, 15 and 24 are equipped with first type mesas 17 having said inactive and active portions, the active portions being arranged adjacent to the first type trench 14 (implemented as control trench) and the inactive portions being for example arranged adjacent to second type trench 16 (e.g., source trench) or to the first type trench 14 (implemented as dummy trench, cf. explanation below).

In an embodiment of the power semiconductor device 1, the doped contact region 109 is a p-type emitter, and the first type mesa 17 may entirely laterally overlap with the p-type emitter 109.

Further, the plurality of mesas may comprise at least one second type mesa 18 that is configured to not conduct the load current. For example, in the active region 1-2, a first transition 185 between the first load terminal 11 and the second type mesa 18 provides an electrical insulation at least for charge carriers of the first conductivity type. In an embodiment, the power cell 1-1 may be configured to prevent the load current from crossing said first transition 185 between the second type mesa 18 and the first load terminal 11. For example, the second type mesa 18 may allow for inducing an inversion channel; however, in an embodiment, an induced inversion channel within the second type mesa 18 does not carry the load current or a part thereof. In contrast to the first type mesa 17, the second type mesa 18 does not conduct the load current during the conducting state of the power semiconductor device 1, in accordance with an embodiment. For example, the second type mesa 18 can be considered as a decommissioned mesa that is not used for the purpose of carrying the load current.

In a first embodiment of the second type mesa 18, the second type mesa 18 is not electrically connected to the first load terminal 11, but electrically insulated from, e.g., by means of the insulation layer 112. In this embodiment, the first transition 185 between the first load terminal 11 and the second type mesa 18 provides an electrical insulation not only for charge carriers of the first conductivity type, but also for charge carriers of the second conductivity type. To this end, in a variant, the second type mesa 18 comprises neither section of the source region 101 nor a section of the channel region 102 nor is the second type mesa 18 contacted by means of a contact plug (cf. reference numeral 111), as illustrated in FIG. 2. In another variant, the second type mesa 18 may be configured in a similar manner as the first type mesa 17, e.g., by also comprising a section of the source region 101 and/or a section of the channel region 102, the difference to the first type mesa 17 including that neither the section of the source region 101 (if present) nor the section of the channel region 102 of the second type mesa 18 is electrically connected to the first load terminal 11. In accordance with the first embodiment of the second type mesa 18, no current at all crosses said first transition 185.

In a second embodiment of the second type mesa 18, the second type mesa 18 may be electrically connected to the first load terminal 11, wherein the first transition 185 between the first load terminal 11 and the second type mesa 18 provides an electrical insulation only for charge carriers of the first conductivity type, but not for charge carriers of the second conductivity type. In other words, in this second embodiment, the second type mesa 18 may be configured at allow a current of charge carriers of the second conductivity type, e.g., a hole current, to pass said first transition 185. For example, depending on the electrical potential of an electrode, e.g., trench electrode 141, adjacent to the second type mesa 18, such hole current may only temporarily come into being, e.g., shortly before carrying out a turn-off operation, e.g., so as to reduce the total charge carrier concentration present in the semiconductor body 10. As stated above, in this second embodiment, the second type mesa 18 may be electrically connected to the first load terminal 11. For example, a doped contact region (not illustrated) with dopants of the second conductivity type of the second type mesa 18 may be electrically connected to the first load terminal 11, e.g., by means of a contact plug similar or identical to the type of first contact plug 111 that may be used to contact the first type mesa 17. The doped contact region (not illustrated) with dopants of the second conductivity type and may isolate the section of the drift region 100 that is present within the second type mesa 18 from the first load terminal 11. For example, in accordance with the second embodiment of the second type mesa 18, within the second type mesa 18, there is no region doped with dopants of the first conductivity type that is electrically connected to the first load terminal 11. For example, in accordance with the second embodiment of the second type mesa 18, the second type mesa may comprise a section of the channel region 102 that may be locally electrically connected to the first load terminal 11 within the active region 1-2.

The above illustrated first embodiment and second embodiment of the second type mesa 18 may allow for providing the configuration of the power cell 1-1 to prevent the load current from crossing said first transition 185 between the second type mesa 18 and the first load terminal 11.

The second type mesa 18 may be laterally confined by at least the first type trench 14 and one further trench, which will be elucidated further below. For example, even though the trench electrode 141 of the adjacent first type trench 14 may be electrically connected to the control terminal 13, the said trench electrode 141 is not configured to control the load current in the second type mesa 18, since even if the second type mesa 18 allows for inducing an inversion channel within the second type mesa 18, said inversion channel would not carry a port of the load current, in accordance with an embodiment.

The first type trench 14 whose trench electrode 141 is electrically connected to the control terminal 13 may also be arranged adjacent to the second type mesa 18; however, according to the aforesaid, even when receiving a corresponding control signal, the electrical potential of the trench electrode 141 of the first type trench 14 would not cause flow of a part of the load current in the second type mesa 18. Accordingly, in an embodiment where the first type trench 14 is arranged adjacent to a second type mesa 18 on each side (or, respectively, adjacent to the second type mesa(s) 18 and/or the inactive mesa portion(s) of the first type mesa 17), the first type trench 14 can be considered as dummy trench, as no matter which control signal its trench electrode 141 receives, flow of the load current in its adjacent second type mesas 18/inactive mesa portions of the first type mesa 17 (left and right side) is prevented due to the configuration of the second type mesas 18 (or, respectively, configuration of the inactive mesa portions of the first type mesas 17) and/or the configuration of said first transition 185 between the second type mesas 18 and the first load terminal 11.

Hence, in accordance with one or more embodiments, each power cell 1-1 may comprise at least two first type trenches 14, one of which being implemented as a control trench for controlling the load current, and the other one being implemented as dummy trench. Herein, the first type trench 14 implemented as control trench is arranged adjacent to the at least one (active portion of) first type mesa 17, and the first type trench 14 implemented as dummy trench is arranged adjacent to only one or more of the second type mesa 18 and the inactive portion of the first type mesa 17. As will be explained below when presenting various contacting schemes of the power cells 1-1, the first type trench 14 implemented as control trench is referred to as "G", whereas the first type trench 14 implemented as dummy trench is referred to as "D".

The plurality of trenches may further comprise at least one second type trench 15 and/or 16 whose trench electrode 151/161 is either electrically connected to an electrical potential different from the electrical potential of the control terminal 13 or electrically floating. For example, the second type trench includes at least one floating trench 15 whose trench electrode 151 is electrically floating and/or at least one source trench 16 whose trench electrode 161 is electrically connected to the first load terminal 11.

In an embodiment, the trench electrode 151 of the floating trench 15 is neither electrically connected to the first load terminal 11, nor electrically connected to the second load terminal 12, nor electrically connected to the control terminal 13, nor to a section of the semiconductor body 10. Regarding the electrical potential of the electrically floating trench electrode 151, the trench electrode 151 of the floating trench 15 is in another example connected, by means of a connection having a high ohmic resistance, to a defined electrical potential (e.g., to an electrical potential of a contact or to an electrical potential of another semiconductor region). For example, by means of said high ohmic connection, during a switching operation of the device 1, the electrical potential of the electrically floating trench electrode 151 is temporarily decoupled from the defined electrical potential. Said decoupling may occur on a time scale of said switching operation, e.g., for at least 10 ns, or at least 100 ns, or at least 10 μs. For example, the resistance of said high ohmic connection amounts to more than 1e2Ω, or to more than 1e6Ω. In an embodiment, an ohmic resistance, e.g. measured during a standstill situation, between the first load terminal 11 and the electrically floating trench electrode 151 amounts to more than 1e2Ω, or to more than 1e6Ω.

Various possibilities exist to design the power cells 1-1 with regards to the neighborhood relationship (contacting schemes with respect to mesas and trench electrodes) and the respective number of first type mesa(s) 16, the second type mesa(s) 17, the first type trench(es) 14, and the second type trench(es) 15/16. In one embodiment, it is ensured that the first type mesa 17 is spatially confined by the first type trench 14 on the one side and by the source trench 16 on the other side. Further, it can be ensured that the second type mesa 18 is spatially confined at least by one of the first type trenches 14 or that the second type mesa 18 is spatially confined by one first type trench 14 one each side.

As has been indicated above, the power semiconductor device 1 can be an IGBT, e.g., an IGBT having a micro-pattern-trench (MPT) structure.

For example, in accordance with the MPT structure, the ratio of trench open area to mesa area is at least 30% or even more than 50%, or even more than 150% with an aspect ratio of trench depth to trench width of more than 1:3, or more than 1:5, which defines the loading conditions during trench etch. Under these conditions, the trench etch process may be sensitive to local variations in trench opening and size, and may result in a change of trench depth for varying conditions, over a single die and/or wafer. This may be an undesired effect as it may locally change the penetration of the electric field into the trench insulator in a blocking condition of the device. Such an uneven electric field may cause damage to the trench insulator of a trench section with increased trench depth, potentially impacting device performance and/or quality and/or reliability. Hence, it is desired to minimize variations in trench size and opening dimensions.

Further, in accordance with the MPT structure, each of the trenches 14, 15, 16 that may be included in the power cell 1-1 may exhibit substantially equal spatial dimensions and may be arranged in accordance with a regular pattern. For example, each of the trenches 14, 15, 16 may exhibit a depth along the vertical direction Z within the range of 3 μm to 8 μm, and a width along the first lateral direction X within the range of 0.4 μm to 1.6 μm. Further, each of the trench electrodes 141, 151, 161 of all trenches 14, 15, 16 that may be included in the at least one power cell 1-1 may substantially exhibit equal spatial dimensions. In addition, each of the trenches 14, 15, 16 that may be included in the at least one power cell 1-1 can be arranged equidistantly along the first lateral direction X. For example, each of the first type mesa 17 and the second type mesa 18 of each power cell 1-1 may exhibit the same width in the first lateral direction X, which may be within the range of 0.1 μm to 0.3 μm, within the range of 0.3 μm to 0.8 μm, or within the range of 0.8 μm to 1.4 μm. Further, the MPT-IGBT may include a plurality, e.g., more than 100, of such equally configured power cells 1-1.

In an embodiment, the width of the second type mesa 18 (that is, e.g., interrupted by means of the decoupling structure 19, as described above) can be greater than the width of the first type mesa 17, e.g., amount to at least 110% of the width of the first type mesa 17 in the first lateral direction X. For example, the width-increased second type mesa 18 may be arranged adjacent to a respective first type trench 14 on each side.

Regarding cell density, in an embodiment, in a horizontal cross-section of the device 1, the plurality of trenches 14, 15, 16 laterally overlap with at least 30% of the active region 1-2. The remaining portion of the active region 1-2 laterally overlaps with the mesas 17, 18. This ratio can be even increased; e.g., in the horizontal cross-section, the plurality of trenches 14, 15, 16 laterally overlap with at least 40% or even 50% of the active region 1-2, wherein the remaining portion of the active region 1-2 laterally overlaps with the mesas 17, 18.

For the following explanations, the following abbreviations may apply:
G=first type trench 14, in the form of a control trench controlling the load current in the channel region 102
D=first type trench 14, in the form of a dummy trench not controlling the load current
S=second type trench 16, in the form of a source trench 16
F=second type trench, in the form of a floating trench 15
k=first type mesa 17
o=second type mesa 18

As has been stated above, the power semiconductor device 1 may comprise a plurality of equally configured power cells 1-1. In an embodiment, using the abbreviations introduced above, exemplary neighborhood relationship within in each power cell 1-1 may be expressed as follows:
exemplary neighborhood relationship #1: kGkSoSoDoDoSoS
exemplary neighborhood relationship #2: kGkSoFoDoDoDoDoFoS
exemplary neighborhood relationship #3: kGkSoSoDoDoSoS Other neighborhood relationships will be described further below.

Figure 5A:
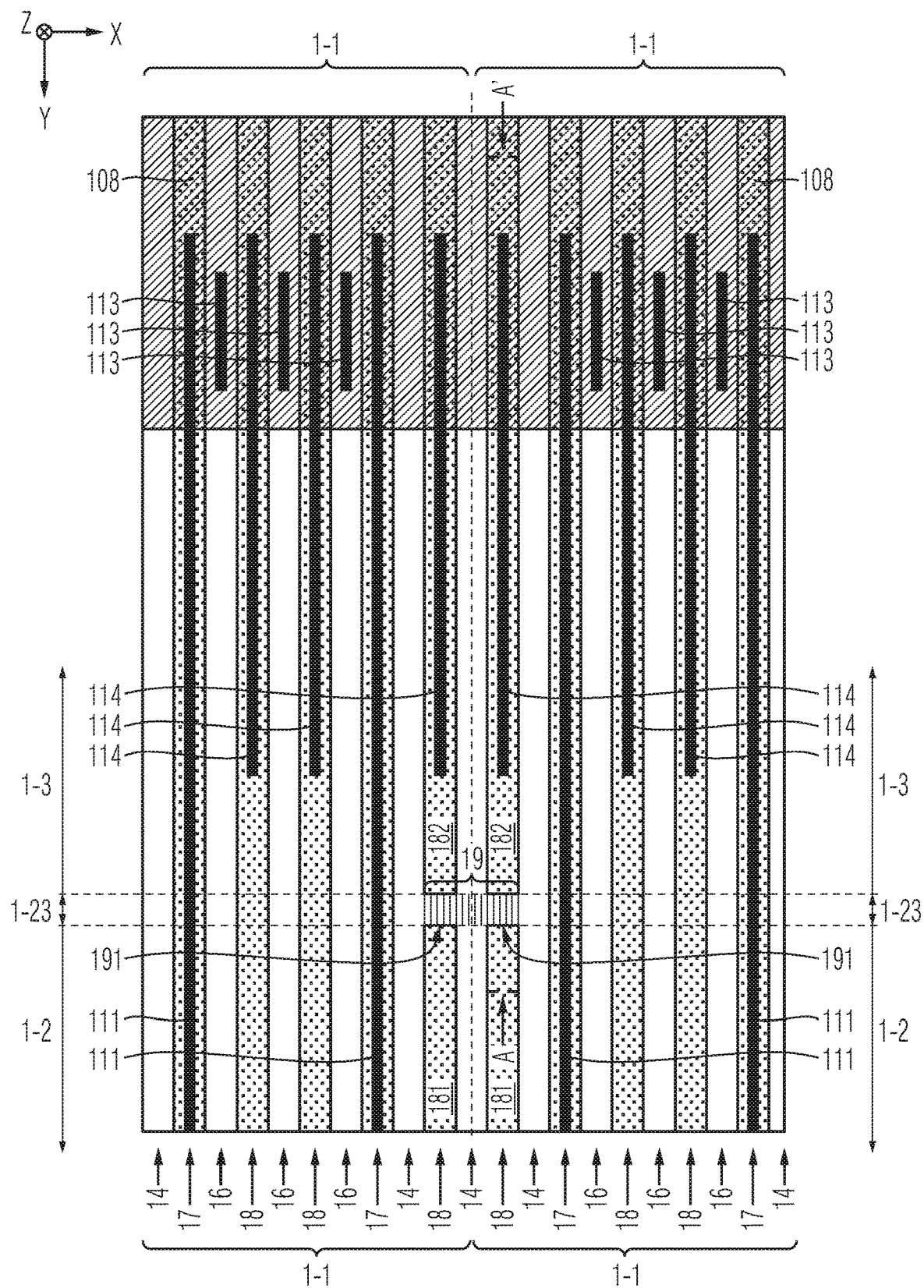
FIGS. 5A-5B each schematically and exemplarily illustrate a section of a horizontal projection of a power semiconductor device in accordance with one or more embodiments.

FIG. 5A schematically and exemplarily illustrates a section of a horizontal projection of the power semiconductor device 1 in accordance with one or more embodiments. The power semiconductor device 1 may comprise a decoupling structure 19 that is arranged within at least one of its second type mesas 18. The decoupling structure 19 can separate said at least one second type mesa 18 into a first section 181 formed at least by the semiconductor body 10 in the active region 1-2 and into a second section 182 formed at least by the semiconductor body 10 in the termination region 1-3. For example, the first section 181 is not electrically connected to the first load terminal 11, whereas the second section 182 may be electrically connected to the first load terminal 11. In an embodiment, within the second section 182, said first transition 185 that may provide for an electrical insulation at least for charge carriers of one conductivity type is formed between the first load terminal 11 and the first section 181, wherein, in the termination region 1-3, the second section 182 of said at least one mesa 18 is electrically connected to the first load terminal 11.

Figure 6:
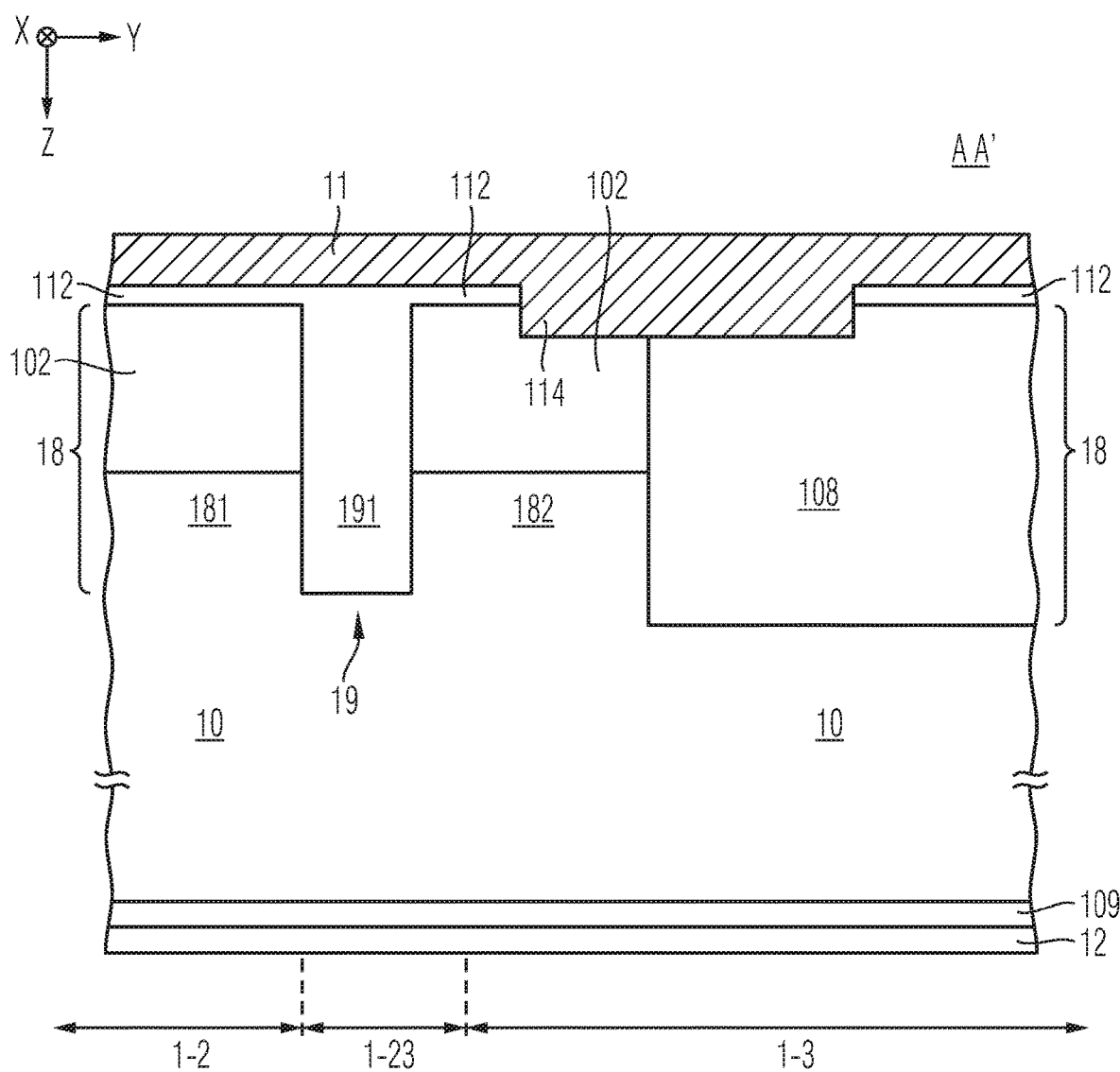
FIG. 6 schematically and exemplarily illustrates a section of a vertical cross-section of a power semiconductor device in accordance with one or more embodiments.

Regarding now additionally FIG. 6, which schematically and exemplarily illustrates a vertical cross-section in parallel to a cut along lines A and A', in the termination region 1-3, the power semiconductor device 1 may comprise a doped semiconductor region 108 (cf. cross-hatched area in FIG. 5A), e.g., a p-doped semiconductor region 108, in accordance with an embodiment (also referred to as "p-well"). For example, the doped semiconductor region 108 may comprise a guard ring or a channel stopper zone of the power semiconductor device 1. Further, the doped semiconductor region 108 may be electrically connected to first load terminal 11, e.g., by means of at least one of a plurality of third contact plugs 114. Further, within the termination region 1-3, the doped semiconductor region 108 may extend into some or all mesas 17, 18 of some or all power cells 1-1, e.g., also into said section 182. Thereby, within the termination region 1-3, the electrical potential of the first load terminal 11 may be introduced into the first and second type mesa 17, 18. For example, the doped semiconductor region 108 extends for at least 2 µm along the vertical direction Z within the semiconductor body 10.

In an embodiment, the doped semiconductor region 108 is arranged exclusively within the inactive termination region 1-3 and surrounds the active region 1-2.

For example, the decoupling structure 19 is laterally displaced from the doped semiconductor region 108 by at least 200 nm, at least 500 nm or at least 1000 nm toward the active region 1-2. E.g., an envelope course surrounds all source regions 101 of the active region 1-2. A transition region 1-23 may extend into the portion formed between the doped semiconductor region 108 and the envelope course. For example, the decoupling structure is arranged within the lateral central third of said portion.

In accordance with an embodiment, the decoupling structure 19 is configured to electrically decouple the first section 181 from the second section 182. For example, the decoupling structure 19 may dampen an eventual influence of the first load terminal's electrical potential that may be present within the second section 182 onto the first section 181. Thereby, the electrical potential of the first section 181 can be different from the electrical potential of the second section 182, in accordance with an embodiment. For example, the electrical potential of the first section 181 is floating, whereas the electrical potential of the second section 182 can be fixed to the first load terminal 11. Presence of the decoupled second section 182 within the active region 1-2 may allow for an improved controllability of at least one of a slope of the voltage (dV/dt) and/or a maximum slope of the load current (dI/dt) during a switching operation of the power semiconductor device 1, in accordance with an embodiment.

For example, the first section 181 extends along the second lateral direction Y for at least 1 mm within the active region 1-2, e.g., without being subjected to any further separation or interruption.

In an embodiment, the decoupling structure 19 may provide for an electrical insulation within a vertical cross-section of said at least one mesa (e.g., the second type mesa 18) that is being separated into said sections 181, 182. Said vertical cross-section may be perpendicular to the second lateral direction Y, as exemplarily illustrated in FIG. 5A and FIG. 6. To this end, the decoupling structure 19 may exhibit a vertical cross-section related ohmic resistance at least ten times as large as a vertical cross-section related ohmic resistance of the first section 181. The factor can be even greater than 10, e.g., greater than 50, greater than 100 or even greater than 1000. For example, the decoupling structure 19 is different from the semiconductor body 10. The decoupling structure 19 can comprise an insulator, e.g., an oxide, that fills said vertical cross-section of said at least one mesa 18 that is being separated into said sections 181, 182. Thus, in an embodiment, at least one of the at least one second type mesa 18 of the power cell 1-1 can be interrupted by an insulator of the decoupling structure 19 that entirely fills a vertical cross-section of said second type mesa 18, said vertical cross-section being arranged perpendicular to the second lateral direction, i.e., perpendicular to the longer lateral extension of the stripe configuration.

In an embodiment, the decoupling structure 19 may extend along the vertical direction Z at least as far as each of the two trenches of the power cell 1-1 that laterally confine said at least one second type mesa 18. This optional aspect is schematically and exemplarily illustrated in FIGS. 8 and 9, where the second type mesa 18 that is separated into the first section 181 and the second section 182 by the decoupling structure 19 is spatially confined by two first type trenches 14, e.g., one control trench and one dummy trench. For example, the decoupling structure 19 may exhibit a depth along the vertical direction Z within the range of 3 µm to 8 µm. Further, the decoupling structure 19 may have a total extension in the second lateral direction Y of less than 5% of the total extension of said at least one second type mesa 18 that is separated into the first section 181 and the second section 182 in the second lateral direction Y. For example, only a small region of the second type mesa 18 is thereby employed for realizing the decoupling structure 19.

Figure 7:
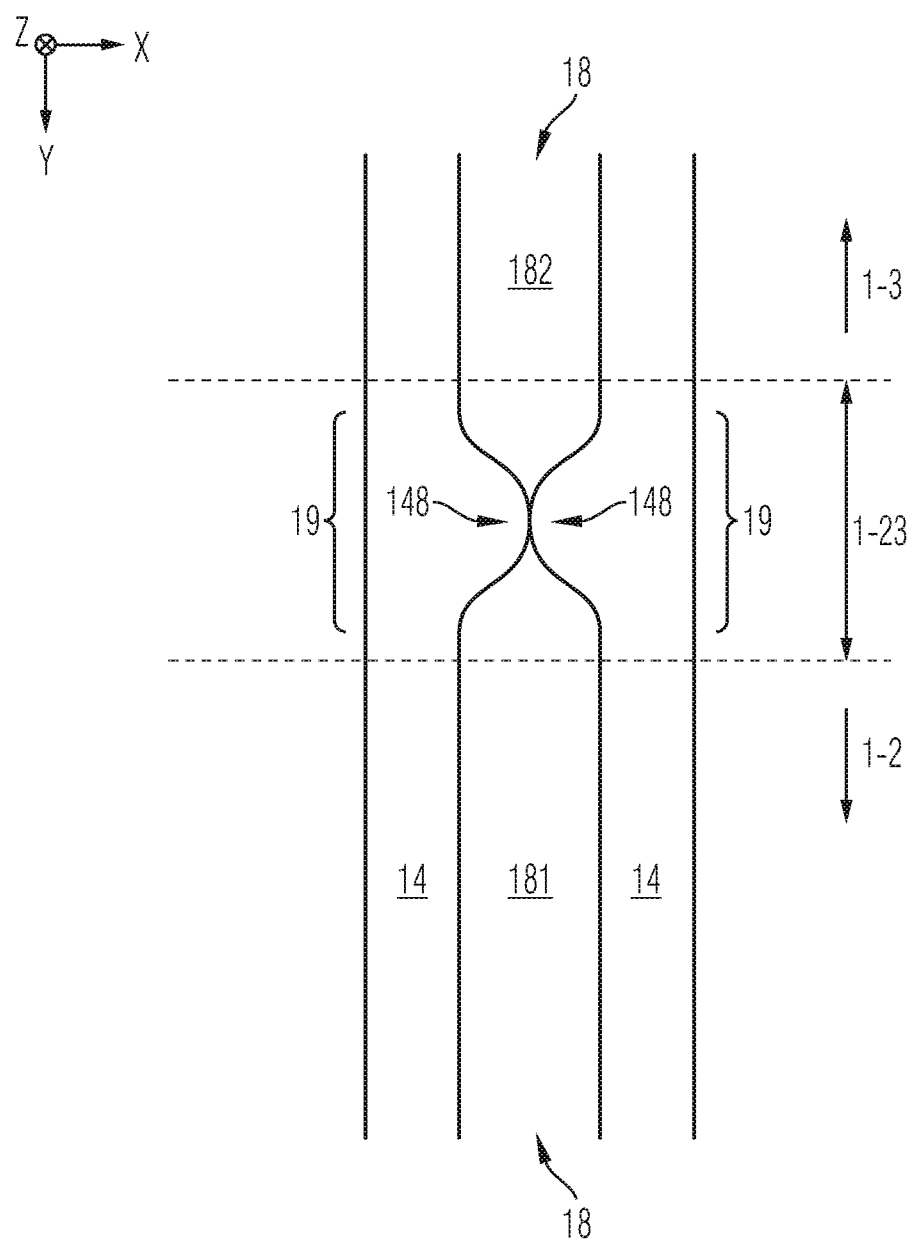
FIG. 7 schematically and exemplarily illustrates a section of a horizontal cross-section of a power semiconductor device in accordance with one or more embodiments.

Regarding FIG. 7, in accordance with another embodiment, the decoupling structure 19 can include a respective spacer trench section 148 of the two trenches that laterally confine the mesa that is separated into the first section 181 and the second section 182. For illustration purposes, FIG. 7 shows an embodiment where the second type mesa 18 that is separated into the first section 181 and the second section 182 by the decoupling structure 19 is spatially confined by two first type trenches 14. However, it shall be understood that the trenches could be of another type than the first type.

Now referring to the embodiments illustrated in FIGS. 5A-5B, 6, and 8-15, the decoupling structure 19 can comprise a cross-trench arrangement 191 that extends through said at least one mesa (that is separated into the first section 181 and the second section 182) along the first lateral direction X between at least two of the plurality of trenches 14, 15, 16 of the power cell 1-1. In an embodiment, the decoupling structure 19 consists of the cross-trench arrangement 191. Further, the design of the cross-trench arrangement 191 can be defined within a layout specification of the power semiconductor device 1 and the cross-trench arrangement 191 can hence be created by means of typical processing steps associated with manufacturing the power semiconductor device 1, in accordance with an embodiment.

Figure 8:
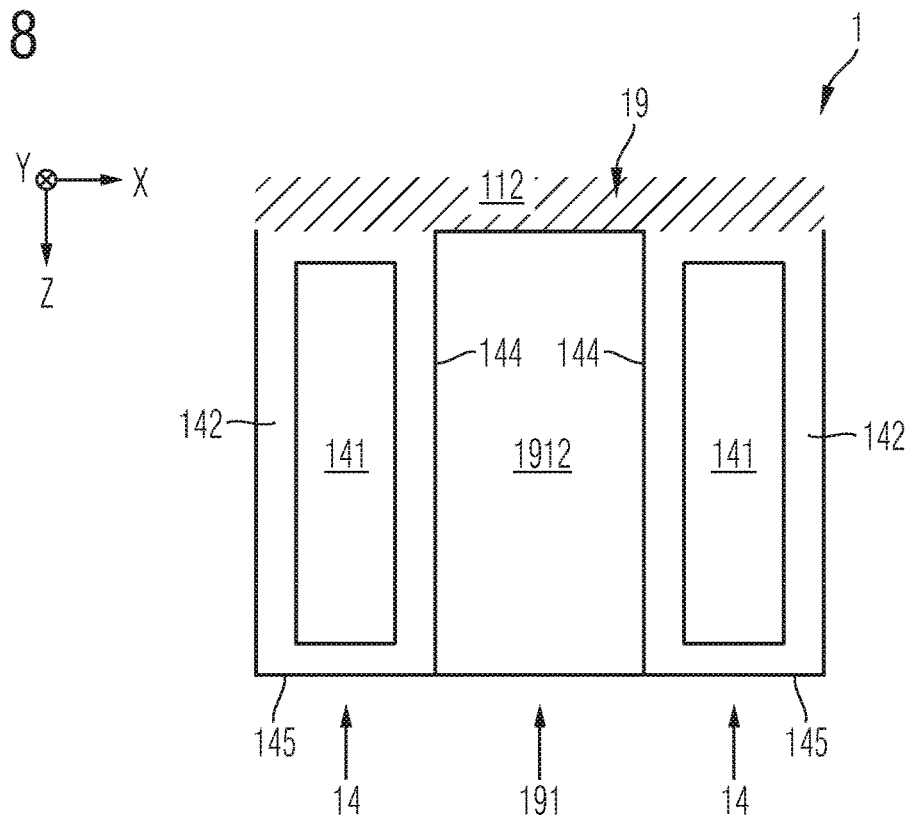
FIGS. 8-9 each schematically and exemplarily illustrate a section of a vertical cross-section of a power semiconductor device in accordance with one or more embodiments.

Regarding for example the embodiment illustrated in FIG. 8, the cross-trench arrangement 191 can consist of an insulating material 1912 that extends between the sidewalls 142 and down to the bottoms 145 of the two trenches (again, as an example, two first type trenches 14) that laterally confine the mesa (again, as an example, a second type mesa 18) that is separated into said sections 181 and 182.

Figure 9:
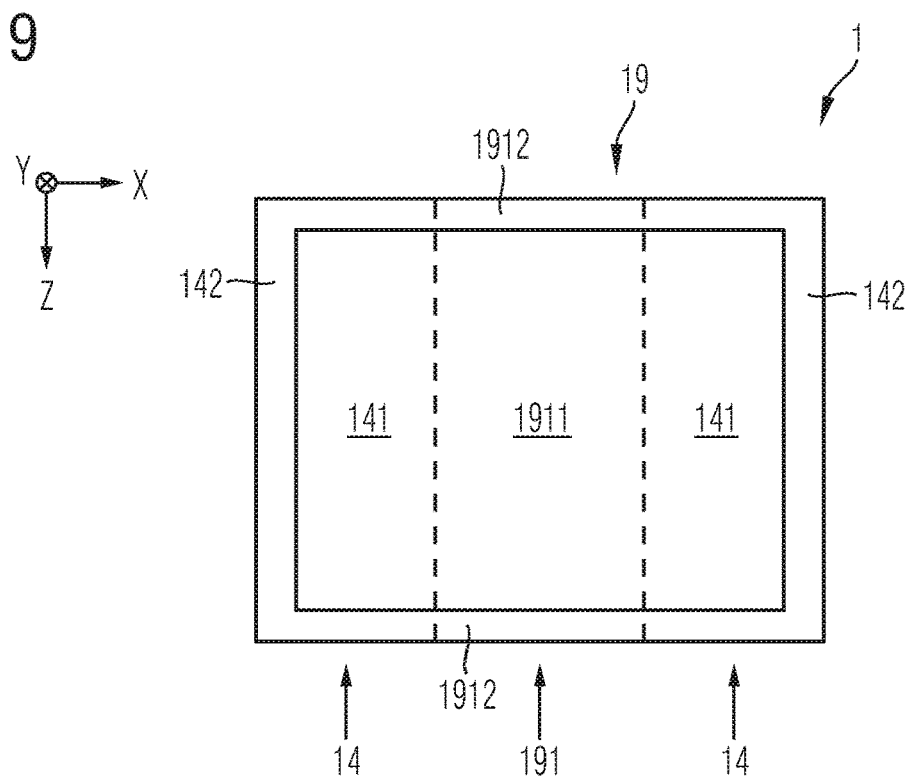

Regarding now the embodiment illustrated in FIG. 9, the cross-trench arrangement 191 can include a cross-trench electrode 1911, e.g., electrically connected with at least one of the trench electrodes of the power cell 1-1. For example, for realizing such electrical connection, the trench insulator 142 of at least one of the two adjacent trenches that spatially confine the mesa that is separated into the first section 181 and the second section 182 can be locally removed, e.g., on one trench side, as exemplarily illustrated in FIG. 9. In another embodiment, the electrical connection can be realized by a connection that extends above the trenches 14.

For example, the cross-trench electrode 1911 may be electrically connected with the trench electrodes 141 of the first type trenches 14, i.e., electrically connected with the control terminal 13.

The above illustrated possible implementations of the decoupling structure 19 are only exemplary; other implementations of the decoupling structure 19 are possible. Further, embodiments of the power semiconductor device 1 can comprise more than only one implementation type of the decoupling structure 19.

In the following, with respect to FIGS. 5A-5B and 10 to 17, further embodiments of the power semiconductor device 1 shall be explained in which different positions and spatial extensions of the decoupling structure 19 are provided.

In accordance with the embodiment of the power semiconductor device 1 illustrated in FIG. 5A, each power cell 1-1 comprises first type mesas 17, second type mesas 18, first type trenches 14 in the form of control trenches and dummy trenches and second type trenches in the form of source trenches 16. The neighborhood relationship of these components can be expressed, using the abbreviations introduced above, as "GkSoSoSkGoD" in one of the power cells 1-1, and the adjacent power cell 1-1 may have a symmetrical arrangement according to the pattern "DoGkSoSoSkG". The trench electrodes 161 of the source trenches 16 may be electrically connected to the first terminal 11 within the termination region 1-2, e.g., by means of second contact plugs 113. Within the termination region 1-2, the third contact plugs 114 may electrically connect the second type mesas 18 to the first load terminal 11. The decoupling structure 19, exemplary implementations of which have been described above, may be arranged in the transition region 1-23 between the active region 1-2 and the termination region 1-3. As illustrated in FIG. 5A, each power cell 1-1 may comprise an implementation of the decoupling structure 19 that separates one of the second type mesas 18 that is spatially confined at least by one of the first type trenches 14 into said first section 181 and said second section 182.

Figure 5B:
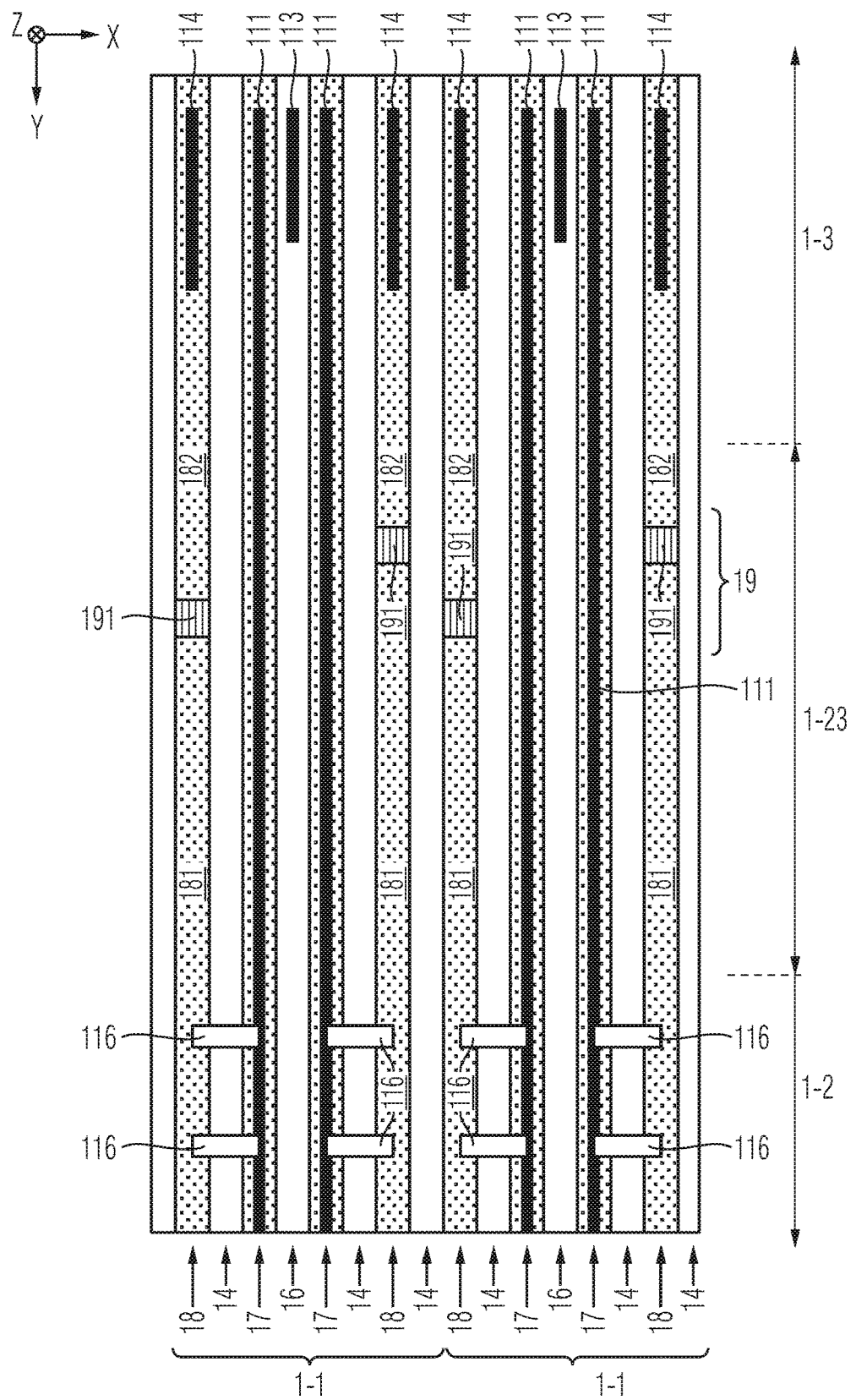

The embodiment as illustrated in FIG. 5B is similar to the embodiment of FIG. 5A, but has a different contacting scheme. For example, as illustrated in FIG. 5B, it may be appropriate to design each cell 1-1 with the following contacting scheme:

oGkSkGoD

For example, this contacting scheme "oGkSkGoD" can be combined with one or more of all the optional features of the power semiconductor device 1 described herein. E.g., everything what is described herein with respect to the decoupling structure 19, the configuration of the mesas 17, 18, the dopant concentrations in the semiconductor body 10 and so on may be implemented in embodiments of the power semiconductor device 1 having the contacting scheme "oGkSkGoD". E.g., it shall be understood that instead of the implementation of the decoupling structure 19 by means of the cross-trench arrangements 191 as illustrated in FIG. 5B, an implementation according to FIG. 7 or 14B (spacer trench sections 148, 168) and/or according to FIGS. 19A-19B (columnar trenches 198) may additionally or alternatively be provided.

Figure 10:
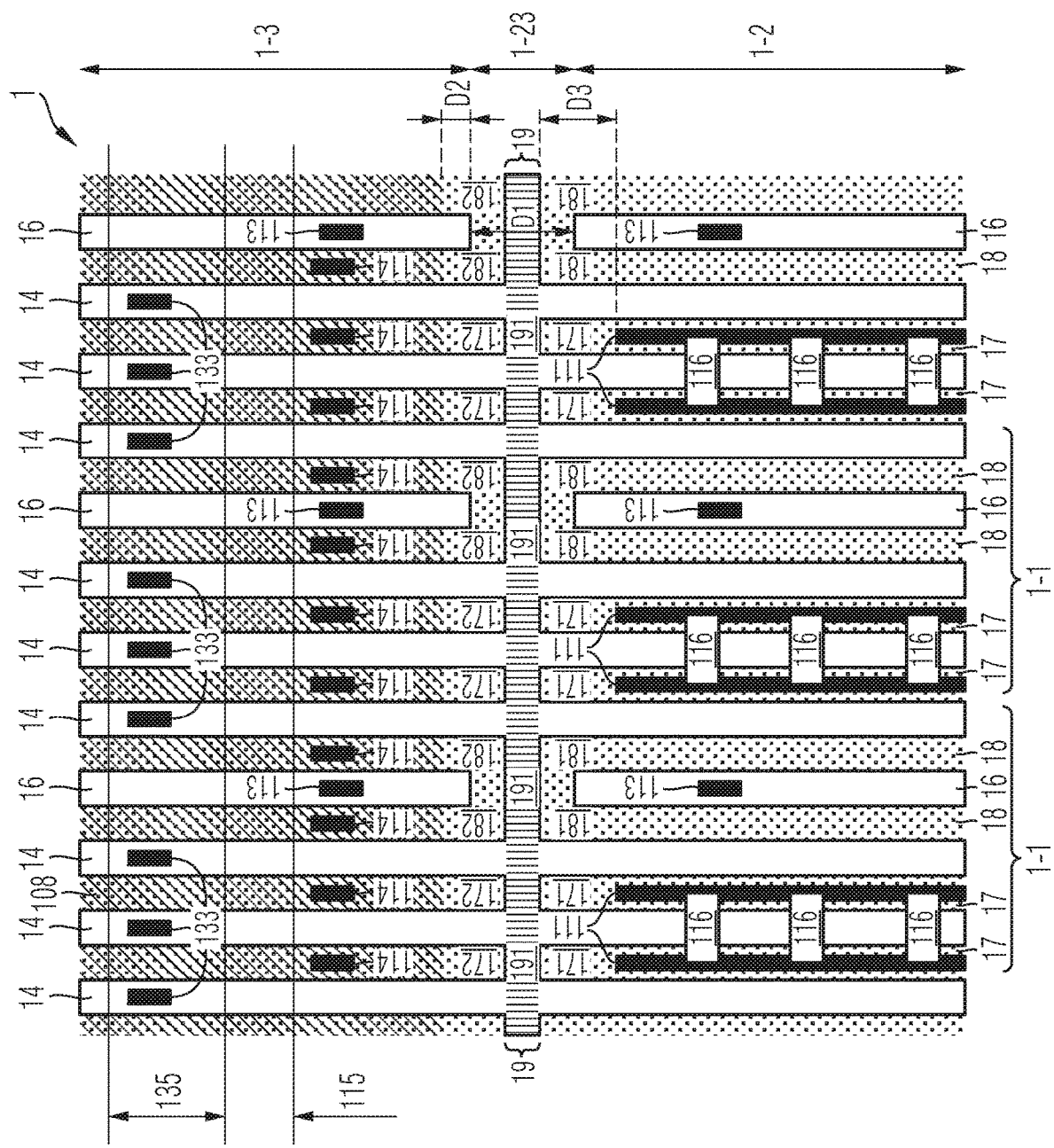
FIGS. 10-13, 14A, 14B, and 15 each schematically and exemplarily illustrate a section of a horizontal projection of a power semiconductor device in accordance with one or more embodiments.

In accordance with the embodiment of the power semiconductor device 1 illustrated in FIG. 10, each power cell 1-1 comprises first type mesas 17, second type mesas 18, first type trenches 14 in the form of control trenches and dummy trenches and second type trenches in the form of source trenches 16. The neighborhood relationship of these components can be expressed, using the abbreviations introduced above, as "kGkGoSoG" for each of the power cells 1-1. For example, the power semiconductor device 1 comprises a control runner 135 in the termination region 1-2 that is electrically connected to the trench electrodes 141 of the first type trenches 14 by means of control electrode plugs 133. The control runner 135 can be electrically connected to the control terminal 13 (cf. FIG. 2). Further, the power semiconductor device 1 may comprise a source runner 115 said extends into the termination region 1-2 and that is electrically connected to the first load terminal 11 on the one side and, on the other side, to (a) the first type mesas 17 and to the second type mesas 18 by means of the third contact plugs 114 and to (b) the trench electrodes 161 of the source trenches 16 by means of the second contact plugs 113. In the active region 1-2, the first contact plugs 111 that may be employed for electrically connecting the first load terminal 11 with the first type mesa 17.

In the drawings, the fields 116 indicate those sections of the semiconductor body 10 where the source region 101 is implemented, in accordance with an embodiment. E.g., additionally referring to FIG. 2, the source region 101 may be implemented only on one lateral side of the first contact plug 111 and does not extend, along the first lateral direction X) throughout the entire first type mesa 17; that is, the first type mesa 17 may comprise said active portion and said inactive portion 18. For example, in accordance with the embodiments shown in FIG. 5B, FIGS. 10, 11, 12, 13, 14A, 15 and 24, the first type mesa 17 is separated, along the first lateral direction X, into said active portion and inactive portion, wherein, for example, said separation may be achieve by a corresponding layout structure of the source region 101.

In accordance with an embodiment, e.g., as schematically and exemplarily illustrated in FIGS. 10 to 15, the decoupling structure 19 is implemented as the cross-trench arrangement 191 that extends along the first lateral direction X. The cross-trench arrangement 191 may extend through each of the plurality of mesas 17, 18 of one, some or all of the power cells 1-1 of the power semiconductor device 1. For example, not only the second type mesas 18 are separated into the respective sections 181 and 182, but also the first type mesas 17 are separated into respective first sections 171 and second sections 172, said first sections 171 of the first type trenches 17 being formed at least by the semiconductor body 10 in the active region 1-2 and said second sections 172 of the first type trenches 17 being formed at least by the semiconductor body 10 in the termination region 1-3. The cross-trench arrangement 191 may be arranged within the transition region 1-23 between the active region 1-2 and the termination region 1-3.

The cross-trench arrangement 191 may further traverse not only the mesas 17, 18, but also at least one of the first type trenches 14 and the second type trenches 16 of the power cells 1-1, e.g. each of second type trenches 16 of the power cell 1-1. Such interruption may allow for an increased flexibility when assigning electrical potentials to trench electrodes and mesa sections, as will also be become apparent from the following explanations.

E.g., in an embodiment, the first section 171 of the first type mesa 17 and the first section 181 of the second type mesa 18 are connected to each other by means of a cross-mesa section 187 adjacent to the cross-trench arrangement 191; this connection may be formed by the respective portion of the semiconductor body 10, as indicated in FIGS. 11 to 15. In an embodiment, said connection can be interrupted, e.g., by a portion of the decoupling structure 19, e.g., one or more spacer trench sections 148, 168, and/or one or more columnar trenches 198, was will be explained in greater detail below.

Hence, in an embodiment, the decoupling structure 19 may be further configured to decouple the first type mesa 17 (e.g., the first section 171 thereof) from the second type mesa 181 (e.g., the first section 181 thereof). Optional ways of realizing such further decoupling will be explained further below.

The cross-trench arrangement 191 may comprise said cross-trench electrode 1911 that is electrically connected to the control terminal 13, e.g., by means of the control electrode plugs 133. The cross-trench electrode 1911 is for example electrically insulated from the trench electrodes 151, 161 of the second type trenches 15, 16. Thus, due to the cross-trench arrangement 191 traversing at least one of the first type trenches 14 and the second type trenches 15, 16, it may be necessary to provide for trench electrode contacts within the active region 1-2, at least for the second type trenches 15, 16, in accordance with an embodiment. For example, to this end, the second contact plugs 113 are also provided in the active region 1-2 for the embodiment illustrated in FIG. 10, whereas the second contact plugs 113 are not needed in the active region 1-2 of the embodiment illustrated in FIG. 5A since, there, the decoupling structure 19 does not traverse the source trenches 16.

Returning to the embodiment of FIG. 10, the cross-trench arrangement 191 may interrupt the second type trenches (implemented as source trenches 16 in FIG. 10), e.g., such that one part of the source trench 16 is arranged with the termination region 1-3 and the other part within the active region 1-2. Such interruption may allow for increasing the flexibility in assigning electrical potentials to the trench electrodes; e.g., the potential assigned within the termination region 1-3 may be different from the potential assigned within the active region 1-2. For example, both parts of a respective separated second type trench (source trench 16 in FIG. 10) may be spatially displaced from the cross-trench arrangement 191, as illustrated in FIG. 10. An interruption distance D1 along the second lateral direction Y may be within the range of 1 µm to 10 µm. For example, the interruption distance D1 is greater than the width of the cross-trench arrangement 191 in the second lateral direction Y. Due to the interruption distance D1, the first sections 181 of two adjacent second type mesas 18 are not entirely separated any more by means of one of the source trenches 16, but in proximity to the cross-trench arrangement 191 merge together, as illustrated in FIG. 10. A distance D2 along the second lateral direction Y may be present between the ends of the trench sections of the interrupted source trenches 16 that are present within the termination structure 1-3 and an end of the doped semiconductor region 108 (cf. cross-hatched area), wherein D2 may be within the range of 0 µm to 10 µm. For example, the source trenches 16 may extend closer to the cross-trench arrangement 191 than the doped semiconductor region 108. A further distance D3 along the second lateral direction Y may be present between the beginnings of the first contact plugs 111 that are present within the active region 1-2 and the cross-trench arrangement 191, wherein D3 may be within the range of 1 µm to 10 µm.

Figure 11:
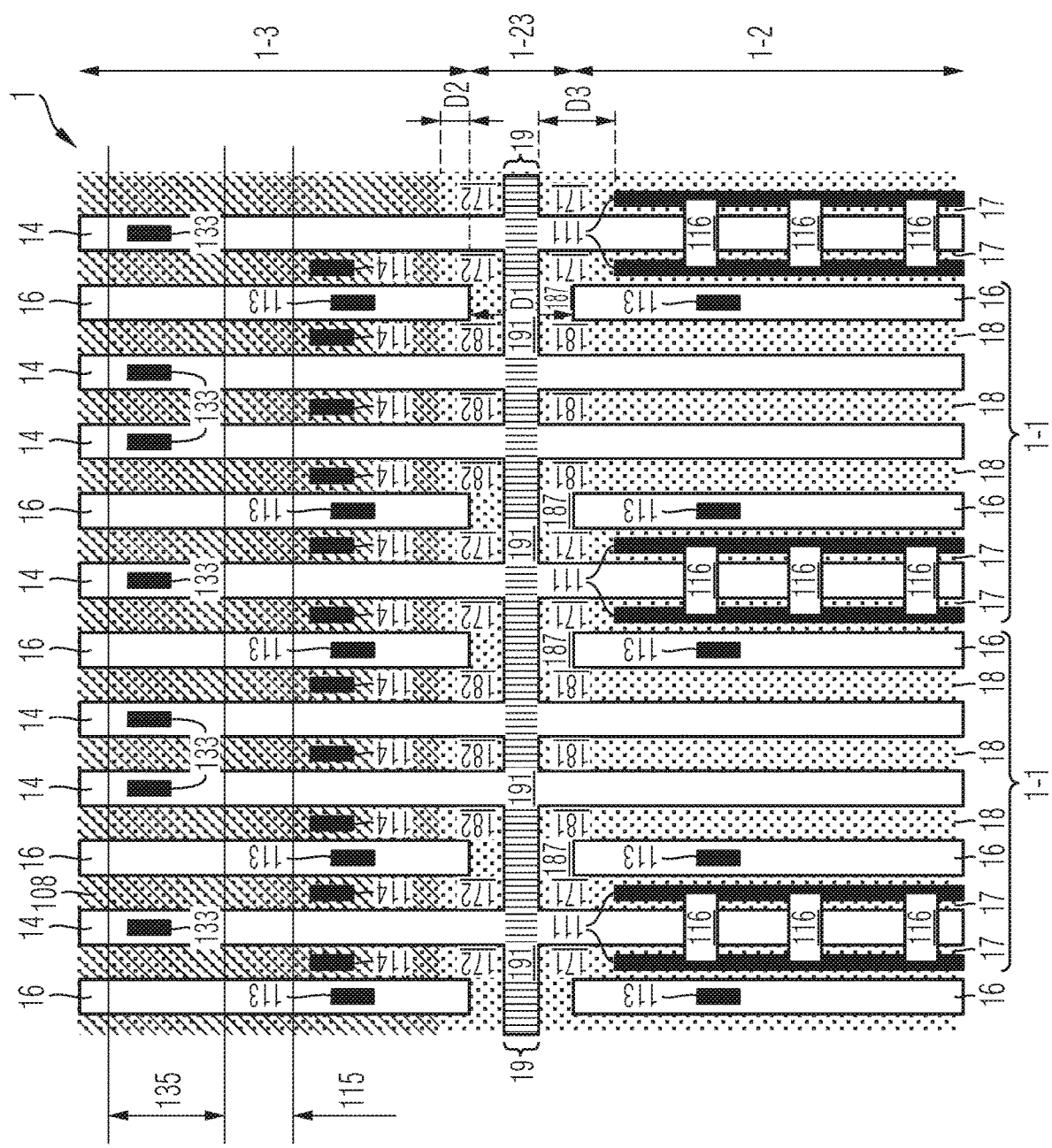

In accordance with the embodiment of the power semiconductor device 1 illustrated in FIG. 11, each power cell 1-1 comprises first type mesas 17, second type mesas 18, first type trenches 14 in the form of control trenches and dummy trenches and second type trenches in the form of source trenches 16. The neighborhood relationship of these components can be expressed as "kGkSoGoGoS" for each of the power cells 1-1. Regarding the implementation of the decoupling structure 19, the explanation provided above with respect to FIG. 10 may equally apply to the embodiment of FIG. 11. The difference in neighborhood relationship may, however, lead to the fact that, in proximity to the decoupling structure 19, one of the first sections 181 of the second type mesas 18 merges with one of the first sections 171 of the first type mesa 17. Nevertheless, in each power cell 1-1, there may remain at least one first section 181 of one of the second type mesas 18 that does not merge with a mesa section that is electrically connected to the first load terminal 11, e.g., that does not merge with a section of one of the first type mesas 17 within the active region 1-2.

Figure 12:
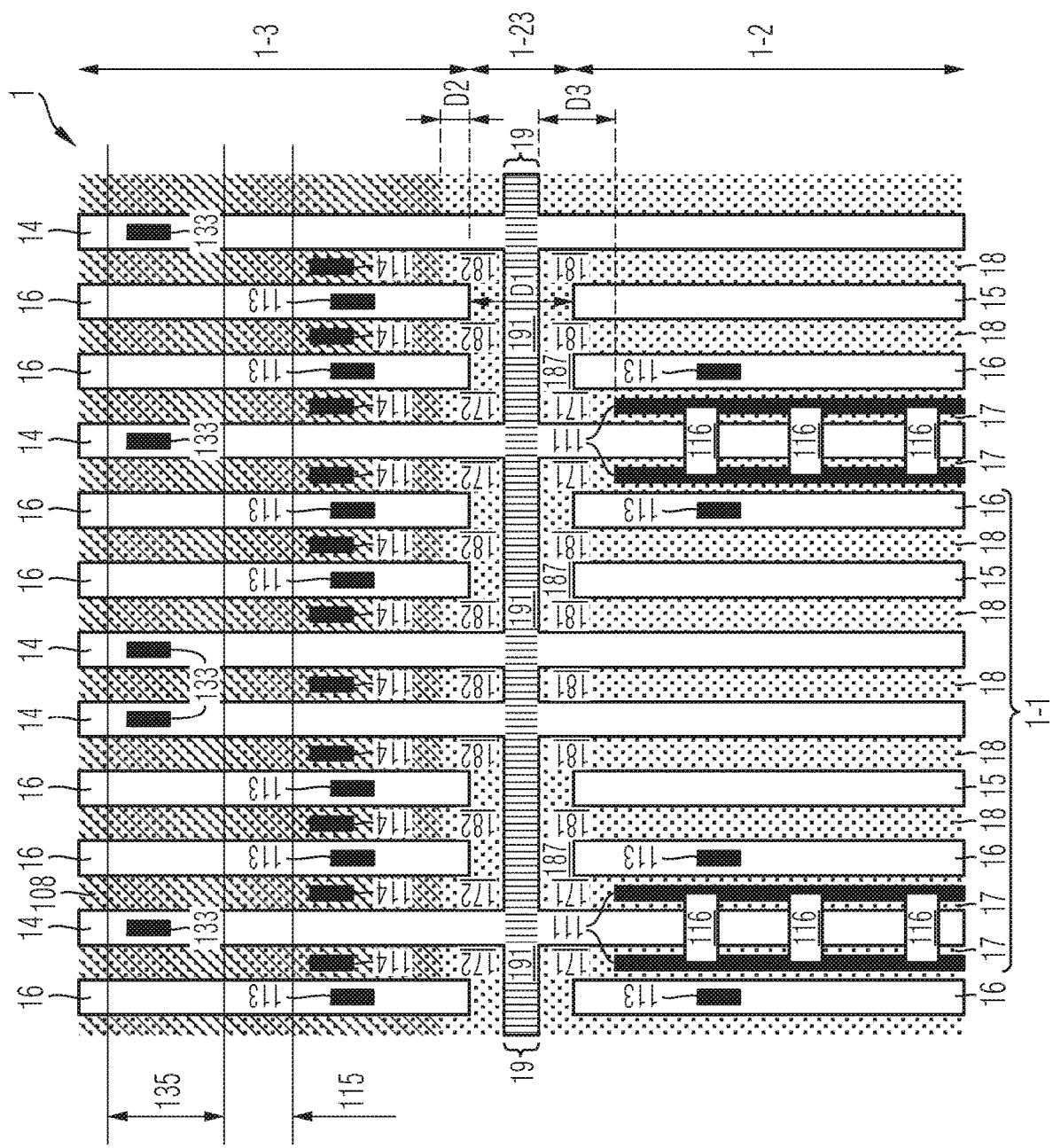

In accordance with the embodiment of the power semiconductor device 1 illustrated in FIG. 12, each power cell 1-1 comprises first type mesas 17, second type mesas 18, first type trenches 14 in the form of control trenches and dummy trenches and second type trenches in the form of floating trenches 15 and source trenches 16. The neighborhood relationship of these components can be expressed as "kGkSoFoGoGoFoS" for each of the power cells 1-1. Regarding the implementation of the decoupling structure 19, the explanation provided above with respect to FIG. 10 may equally apply to the embodiment of FIG. 12. For example, the cross-trench arrangement 191 also interrupts the source trenches 16. For the floating trenches 15 that may include the electrically floating trench electrodes 151, separate contact plugs need to be provided in the active region 1-2. The floating trenches 15 may be spatially displace from the cross-trench arrangement 191. The source trenches 16 may be interrupted such that one part of the source trench 16 is arranged with the termination region 1-3 and the other part within the active region 1-2. For example, both parts of a respective separated second type trench 15/16 may be spatially displaced from the cross-trench arrangement 191, as illustrated in FIG. 12. The same interruption distance D1 along the second lateral direction Y as for the interrupted source trenches 16 may apply to the interrupted floating trenches 15 and may be within the range of 1 μm to 10 μm. Due to the interruption distance D1, the first sections 181 of two adjacent second type mesas 18 are not entirely separated any more by means of one of the floating trenches 15 or one of the source trenches 16, but in proximity to the cross-trench arrangement 191 merge together, as illustrated in FIG. 12.

In accordance with an embodiment, the power semiconductor device 1 comprises, in addition to the decoupling structure 19, an interruption structure 20 arranged within the active region 1-2 and separating the first section 181 of the at least one mesa (that is already being separated by means of the decoupling structure 19) along the second lateral direction Y into at least a first subsection 1811 and into at least a second subsection 1812. In terms of its structural configuration, the interruption structure 20 may be similarly configured as the decoupling structure 19. For example, the interruption structure 20 may extend along the vertical direction Z at least as far as each of the two trenches of the power cell 1-1 that laterally confine said at least one mesa that is being separated by means of the decoupling structure 19, e.g., two first type trenches 14. For example, the interruption structure 20 may exhibit a depth along the vertical direction Z within the range of 3 μm to 8 μm. Further, the interruption structure 20 may have a total extension in the second lateral direction Y of less than 5% of the total extension of said at least one mesa (that is separated into the first section 181 and the second section 182) in the second lateral direction Y. For example, only a small region of said mesa is thereby employed for realizing interruption structure 20. Now referring to the embodiments illustrated in FIGS. 16-17, the interruption structure 20 can comprise a cross-trench arrangement 201 that extends through said at least one mesa (that is separated into the first section 181 and the second section 182) along the first lateral direction X between at least two of the plurality of trenches of the power cell 1-1, e.g., between two first type trenches 14. Regarding for example the embodiment illustrated in FIG. 16, the cross-trench arrangement 201 can consist of an insulating material 2012 that extends between the sidewalls 142 and down to the bottoms 145 of the two trenches (as an example, two first type trenches 14) that laterally confine the mesa that is separated into said sections 181 and 182. Regarding now the embodiment illustrated in FIG. 17, the cross-trench arrangement 201 of the interruption structure 20 can include a cross-trench electrode 2011, e.g., electrically connected with at least one of the trench electrodes of the power cell 1-1, e.g., with at least one of the trench electrodes 141 of the first type trenches 14. For example, for realizing such electrical connection, the trench insulator 142 of at least one of the two adjacent trenches that spatially confine the mesa that is separated into the first section 181 and the second section 182 can be locally removed, e.g., on one trench side, as exemplarily illustrated in FIG. 17. In another embodiment, the electrical connection can be realized by a connection that extends above the trenches 14. Further, the first contact plugs 111 may also be displaced from the cross-trench arrangement 201 by said distance D3 along the second lateral direction Y, wherein D3 may be within the range of 1 to 10 μm.

Figure 13:
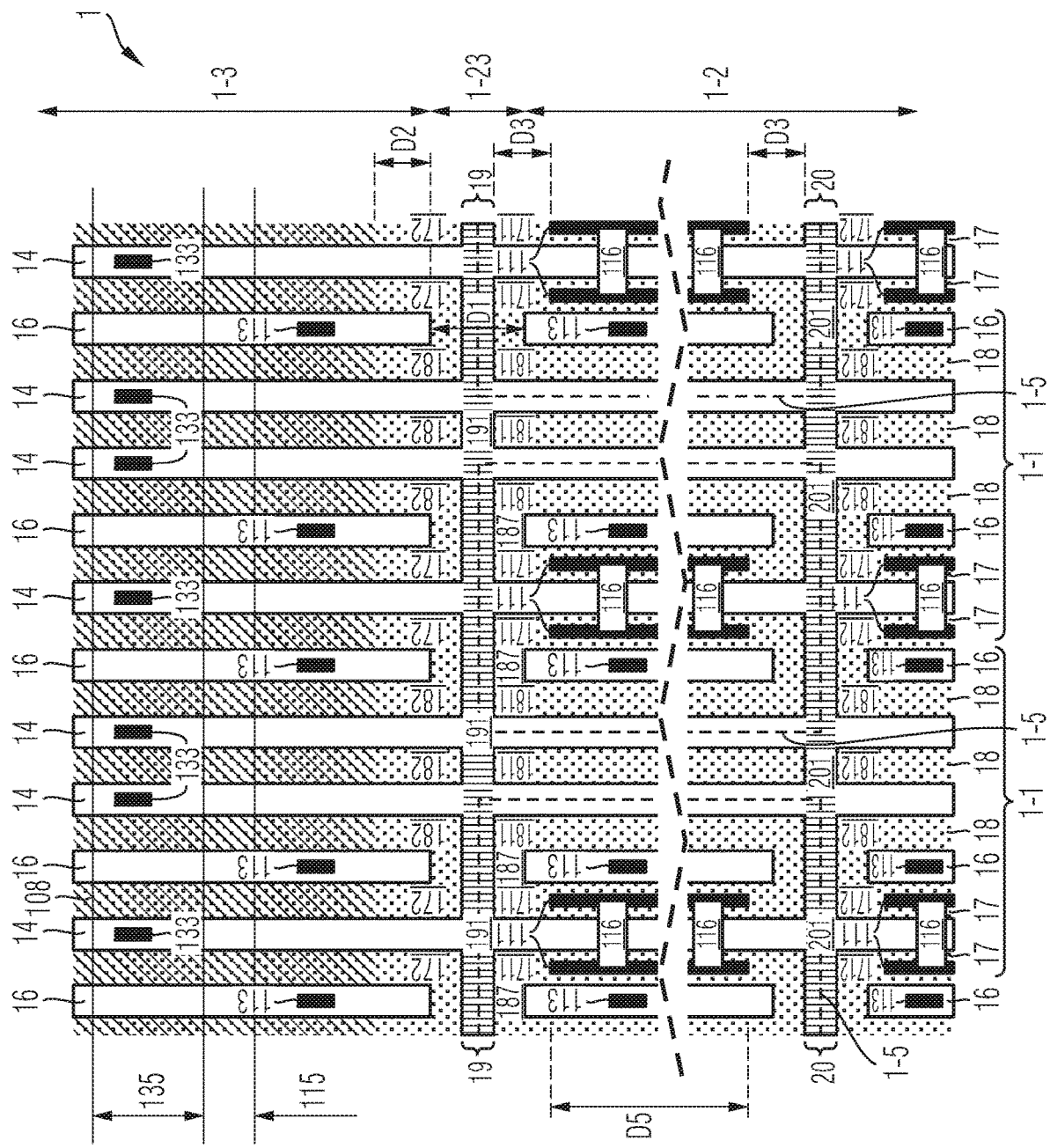

An exemplary use case of such interruption structure 20 is schematically illustrated in FIG. 13. In accordance with the embodiment of the power semiconductor device 1 illustrated in FIG. 13, each power cell 1-1 comprises first type mesas 17, second type mesas 18, first type trenches 14 in the form of control trenches and dummy trenches and second type trenches in the form of source trenches 16. The neighborhood relationship of these components can be expressed as "kGkSoGoGoS" for each of the power cells 1-1, as in the embodiment of FIG. 11. As demonstrated in FIG. 13, the third contact plugs 114 must not necessarily be present in the termination structure 1-3. Nevertheless, the doped semiconductor region 108 can be electrically connected to the first load terminal 11. Regarding the implementation of the decoupling structure 19, the explanation provided above with respect to FIG. 10 may equally apply to the embodiment of FIG. 13. The illustrated dashed line indicates a continuation along the second lateral direction Y. For example, the interruption structure 20 is implemented in a manner as the decoupling structure 19, e.g., as a cross-trench arrangement 201 that extends along the first lateral direction X and interrupts each mesa 17, 18 and each of the second type trenches 16. For example, each of the decoupling structure 19 and the interruption structure 20 comprises the respective cross-trench electrode 1911 and 2011, that are both electrically connected to the control terminal 13, as the trench electrodes of the first type trenches 14. For example, the first type trenches 14 are hence not interrupted by the decoupling structure 19 and not interrupted by the interruption structure 20. Thereby, within the active region 1-2, sub-cells 1-5 can be created that are continuously framed by a closed trench electrode exhibiting the electrical potential of the control terminal 13, said closed trench electrode being formed by the cross-trench electrode 1911 of the decoupling structure 19, the cross-trench electrode 2011 of the interruption structure 20 and by two trench electrodes of two first type trenches 14. For example, two adjacent sub-cells 1-5 are separated from each other by means of at least one of the second type mesas 18 within the active region 1-2, as illustrated in FIG. 13. Said at least one second type mesa 18 may comprise said first section 181 that has been separated from the second section 182 and that may hence be isolated from the electrical potential of the first load terminal 11. As the interruption structure 20 may also interrupt the first type mesas 17, corresponding subsections 1711 and 1712 may come into being. Further, the source trenches 16 may be interrupted by the interruption structure 20 and the corresponding separated parts of the source trenches 16 may be spatially displaced from the interruption structure 20, as illustrated in FIG. 13 and as has been explained with respect to FIGS. 10-12 concerning the decoupling structure 19.

Regarding all embodiments illustrated in FIGS. 11 to 15, it shall be noted that some of the first sections 181 (or their subsections 1811, 1812) of the second type mesas 18 may merge with the first sections 171 (or their subsections 1711, 1712) of the first type mesas 17 in proximity to the decoupling structure 19 and/or in proximity to the interruption structure 20, wherein the first sections 171 (or their subsections 1711, 1712) of the first type mesas 17 may be electrically connected to the first load terminal 11. However, in accordance with all embodiments disclosed herein, each power cell 1-1 of the power semiconductor device 1 may comprise at least one second type mesa 18 that is separated into the first section 181 and the second section 182 by means of the decoupling structure 19, wherein the first section 181 of this at least one second type mesa 18 does not merge with another mesa section that is electrically connected to the first load terminal 11, e.g., a section of one of the first type mesas 17. For example, regarding the embodiments illustrated in FIGS. 11, 13, 14A and 15, this at least one second type mesa 18 is the central one of the three second type mesas 18 that are included in each power cell 1-1. Regarding the embodiment illustrated in FIG. 12, this at least one second type mesa 18 is the central one of the five second type mesas 18 that are included in each power cell 1-1. Further, this at least one second type mesa 18 may be spatially confined by two first type trenches 14, e.g., two first type trenches 14 that are implemented as "dummy trenches", e.g., two first type trenches 14 that are each flanked by two second type mesa 18. Further, the first section 181 of this at least one second type mesa 18 may extend for at least 1 mm along the second lateral direction Y within the active region 1-2. In an embodiment, the power semiconductor device 1 is an IGBT with an MPT structure that is formed by a plurality of implementations of the herein described power cell 1-1, wherein each power cell implementation includes at least one of said first section 181 that extends for at least 1 mm along the second lateral direction Y within the active region 1-2.

Figure 14A:
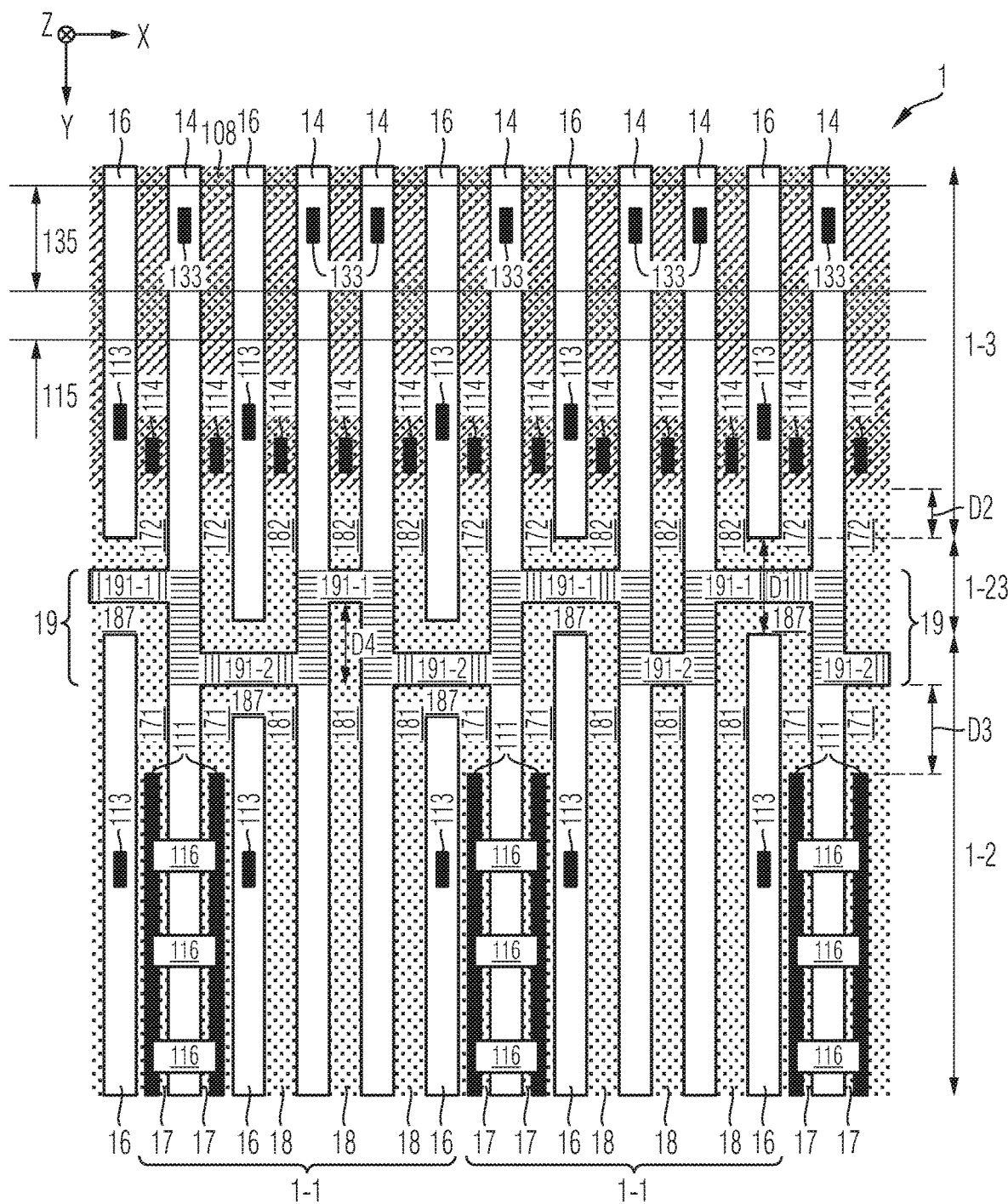

Regarding now the embodiment illustrated in FIG. 14A, the configuration of the power cells 1-1 may correspond to that of the embodiment illustrated in FIG. 11, wherein the setup of the decoupling structure 19 may differ. For example, the cross-trench arrangement 191 of the decoupling structure 19 comprises at least one first cross-trench segment 191-1 and at least one second cross-trench segment 191-2, the at least one second cross-trench segment 191-2 being laterally displaced from the first cross-trench segment 191-1 along each of the first lateral direction X and the second lateral direction Y. For example, the displacement along the second lateral direction Y corresponds to distance D4, which may amount to more than 0.5 μm or to more than 1 μm, e.g., up to 10 μm. Further, the displacement along the first lateral direction X may amount to substantially one trench width, as illustrated in FIG. 14A. For example, by means of such staggering architecture of the decoupling structure 19, one or more steps of processing the decoupling structure 19 can be facilitated, e.g., a trench etching step and/or a polysilicon filling step. Further, the cross-trench arrangement 191 may comprise said the cross-trench electrode 1911, wherein the cross-trench electrode 1911 may extend into each of the at least one first cross-trench segment 191-1 and the at least one second cross-trench segment 191-2. A section of the trench electrode 141 of the first type trench 14 may interconnect the sections of the cross-trench electrode 1911 being present in the cross-trench segments 191-1 and 191-2, wherein said section of the trench electrode 141 may be arranged within the transition region 1-23.

Figure 14B:
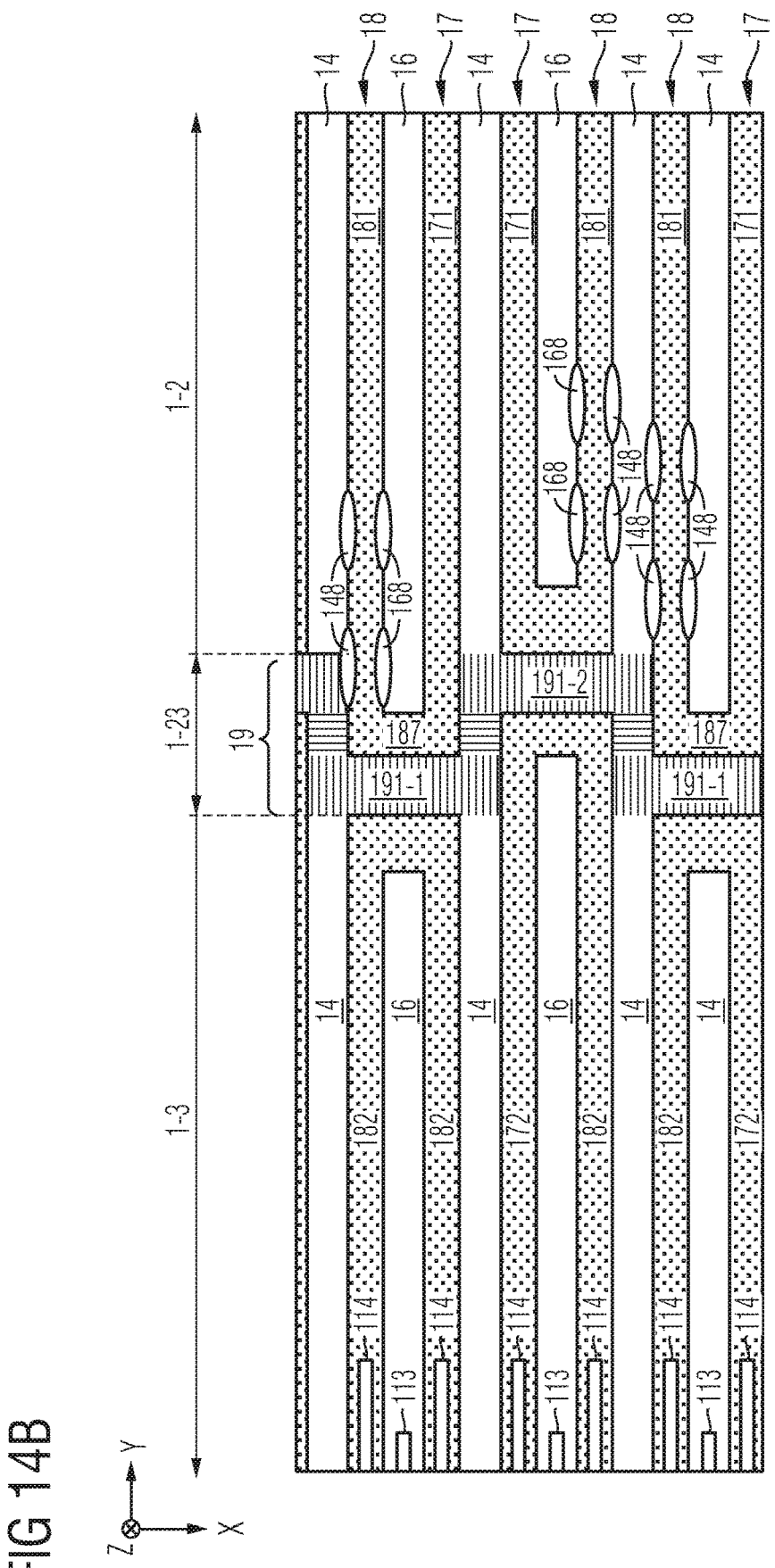

As more clearly illustrated in FIG. 14B, the decoupling structure 19 may include spacer trench sections 148, 168, as addressed with respect to FIG. 7 further above. The spacer trench sections 148, 168 may be formed, e.g., by local trench widenings. For example, the trench widenings may be configured and positioned so as to electrically decouple the first section 171 of the first type mesa 17 and first section 181 of the second type mesa 18 from each other. Thus, it may be ensured that the first mesa sections 171, 181 may exhibit different electrical potentials. E.g., the first section 181 of the second type mesa 18 can be electrically floating whereas the first section 171 of the first type mesa 17 can have the substantially same electrical potential as the first load terminal 11. Depending on the contacting scheme, the spacer trench sections 148, 168 may be formed by widening at least one of the first type trench 14 (e.g., a control (gate) trench) and the second type trench (e.g., a source trench). Many possibilities of where to position the spacer trench sections 148, 168 as well as how many spacer trench sections 148, 168 are to be provided can be chosen by the skilled person; e.g. the number and the position(s) of the spacer trench sections 148, 168 can be chosen such that said first mesa sections 171 and 181 are appropriately decoupled from each other.

Of course, the concept of decoupling said first mesa sections 171 and 181, e.g., by means of the spacer trench section(s) can also be applied to other embodiments than the embodiment of FIG. 14A.

Figure 15:
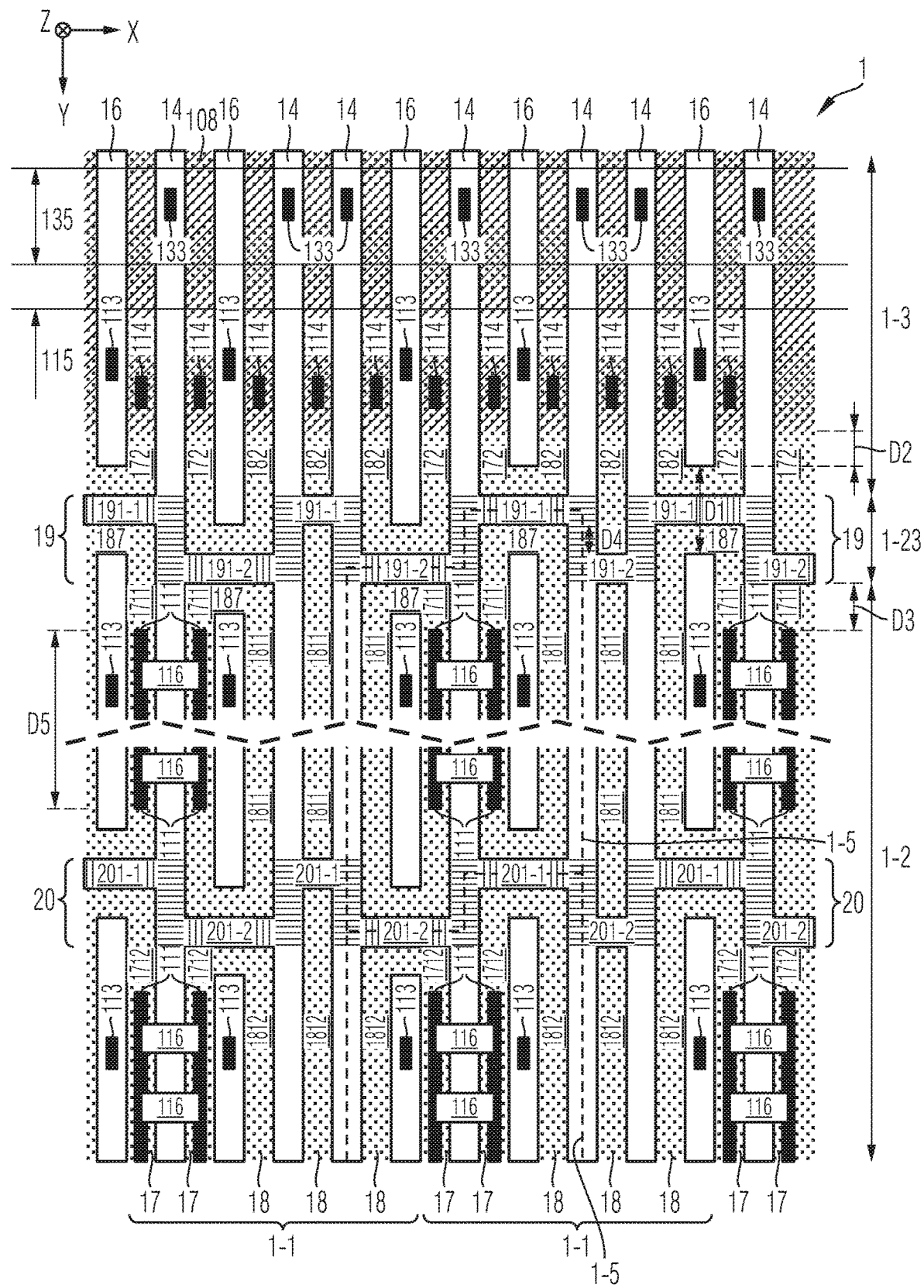
Figure 16:
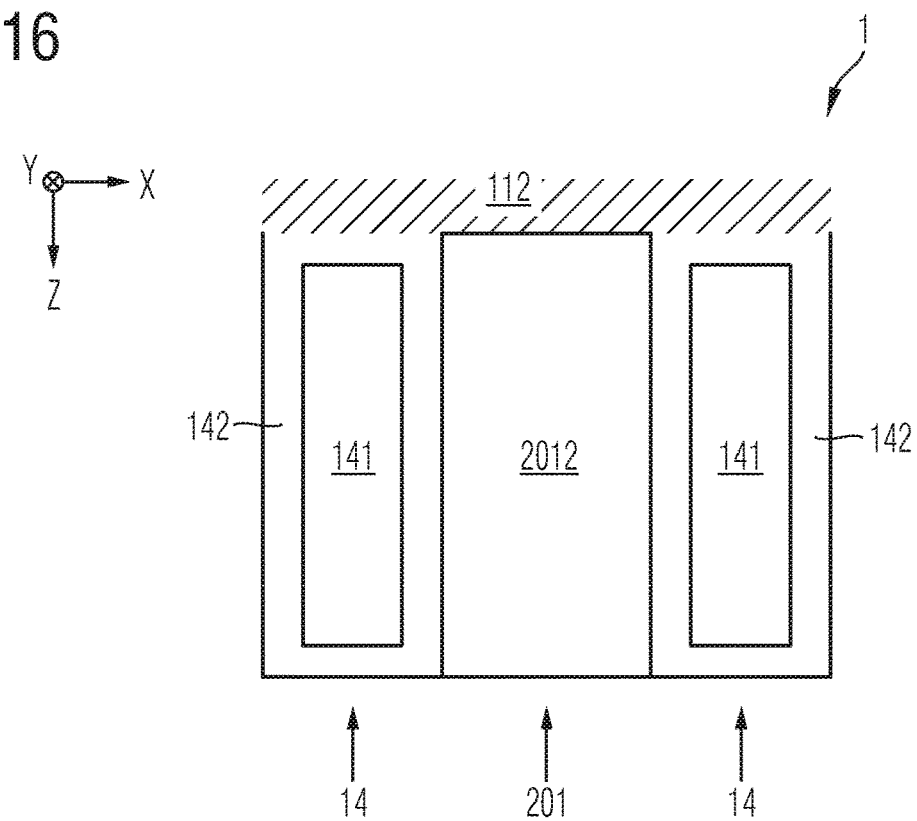
FIGS. 16-17 each schematically and exemplarily illustrate a section of a vertical cross-section of a power semiconductor device in accordance with one or more embodiments.
Figure 17:
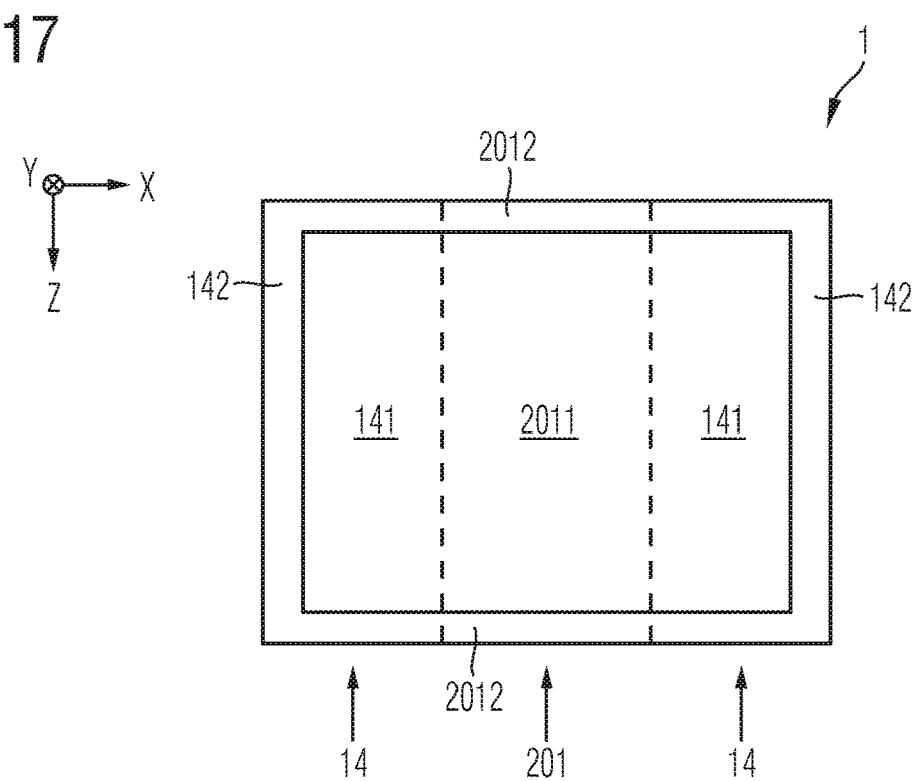

The embodiment illustrated in FIG. 15 can be regarded as a combination of the embodiments of FIG. 14A and FIG. 13; there, the power semiconductor device 1 additionally comprises said interruption structure 20, wherein this interruption structure 20 can be equally configured as the decoupling structure 19, e.g., by comprising at least one first cross-trench segment 201-1 and at least one second cross-trench segment 201-2, the at least one second cross-trench segment 201-2 being laterally displaced from the first cross-trench segment 201-1 along each of the first lateral direction X and the second lateral direction Y. As has been explained with respect to FIG. 13, the interruption structure 20 may be employed to define a plurality of sub-cells 1-5 within the active region 1-2, each sub-cell 1-5 being framed by a closed trench electrode that is electrically connected to the control terminal 13, said closed trench electrode being formed, e.g., by cross-trench electrode sections being present within one of the first cross-trench segments 191-1 and one of the second cross-trench segments 191-2 of the decoupling structure 19, present within sections of three first type trenches 14 and present within one of the first cross-trench segments 201-1 and one of the second cross-trench segments 201-2 of the interruption structure 20, in accordance with an embodiment. As illustrated in FIG. 15, the first contact plugs 111 may each exhibit a length D5 along the second lateral direction Y, wherein D5 may within the range of 2 µm to 1000 µm, in accordance with an embodiment.

The embodiments described above illustrated some examples related to the decoupling structure 19 and to the neighborhood relationship regarding the first and second type trenches 14, 15 and 16 and the first and second type mesas 17, 18, i.e., possible trench-mesa-pattern configurations of the power cell 1-1. In more general terms, embodiments may be configured such that the second type mesas 18 that are arranged in the active region 1-2 and that are spatially confined by one of the first type trenches 14 on each side are decoupled from the termination region 1-3 by means of the decoupling structure 19. Additionally or alternatively, embodiments may be configured such that the second type mesas 18 that are arranged in the active region 1-2 and that are spatially confined by one of the first type trenches 14 on the one side and by one of the source trenches 16 on the other side are decoupled from the termination region 1-3 by means of the decoupling structure 19.

Now referring in more detail to FIGS. 19A to 22B, the decoupling structure may further comprise one or more columnar trenches 198 arranged within the first type mesa 17 and/or the second type mesa 18. For example, at least one of the one or more columnar trenches 198 is arranged in the first section 171 of the first type mesa 17 or in the first section 181 of the second type mesa 18.

E.g., in an embodiment, the first section 171 of the first type mesa 17 and the first section 181 of the second type mesa 18 are connected to each other by means of said cross-mesa section 187 adjacent to the cross-trench arrangement 191. For example, similar to said spacer trench section 148, 168, it may be appropriate to position the one or more columnar trenches 198 in proximity to the cross-mesa section 187 and the cross-trench arrangement 191, e.g., so as to decouple the first section 171 of the first type mesa 17 from the first section 181 of the second type mesa 18.

E.g., as illustrated in FIG. 19A, two columnar trenches 198 may be positioned in the first section 171 of the first type mesa 17, and two columnar trenches 198 may be positioned in the first section 181 of the second type mesa 18, said first sections 171, 181 being connected to each other by means of the cross-mesa section 187. Hence, it may be ensured that the first mesa sections 171, 181 may exhibit different electrical potentials. E.g., the first section 181 of the second type mesa 18 can be electrically floating whereas the first section 171 of the first type mesa 17 can have the substantially same electrical potential as the first load terminal 11.

As illustrated in FIG. 19B, each of the one or more columnar trenches 198 may exhibit a depth smaller than the depth of first type trench 14 and the depth of the second type trench 16. In terms of lateral dimensions, both the widths in the first lateral direction X and the second lateral direction Y may be substantially identical to each other (e.g., yielding a circular horizontal cross-section as in FIG. 19A) or slightly different from each other (e.g., yielding an ellipsoidal cross-section as in FIGS. 22A-22B). For example, both the widths in the first lateral direction X and the second lateral direction Y may be substantially identical to the width in the first lateral direction X of the first type mesa 17.

In an embodiment, at least one of the one or more columnar trenches 198 may comprise a columnar trench electrode 1981 and a columnar trench insulator 1982 that electrically insulates the columnar trench electrode 1981 from the semiconductor body 10.

Figure 20:
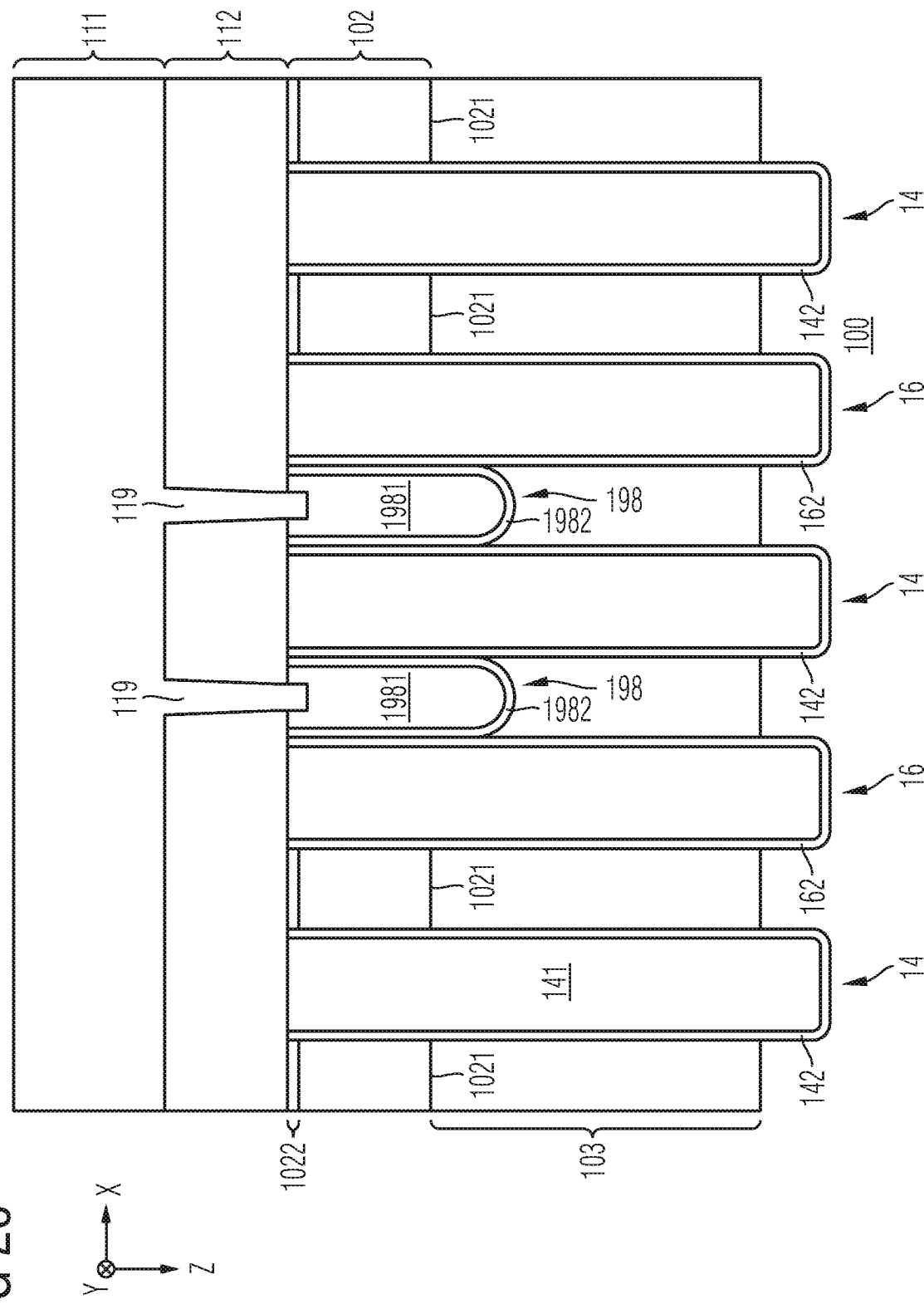
FIGS. 20-21 each schematically and exemplarily illustrate a section of a vertical cross-section of a power semiconductor device in accordance with one or more embodiments.
Figure 21:
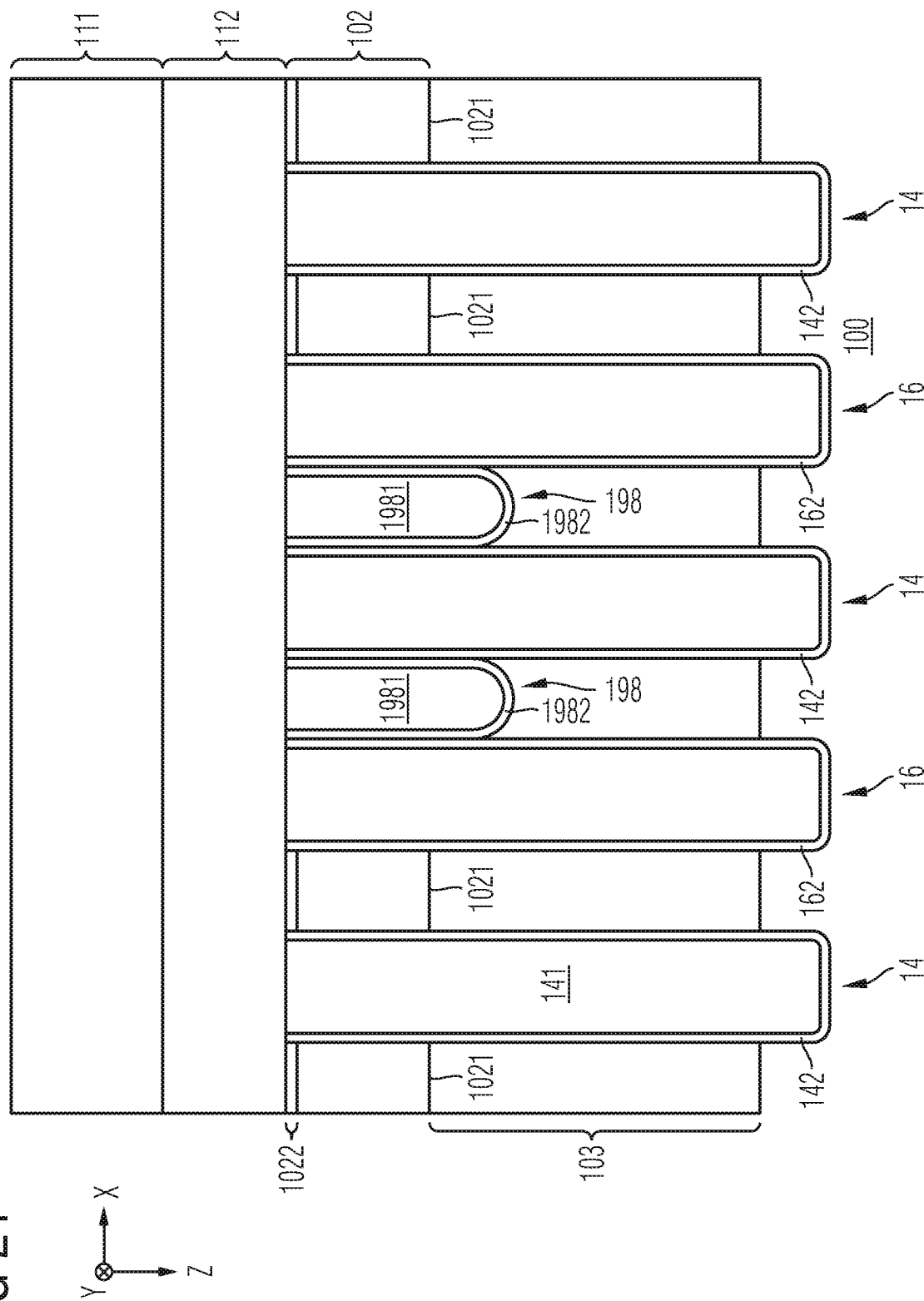

E.g., referring to FIG. 20, the columnar trench electrodes 1981 may be electrically connected to the first load terminal 11, e.g., by means of contact plugs 119. In another embodiment, as illustrated in FIG. 21, the columnar trench electrodes 1981 may be electrically floating.

As illustrated in FIG. 20, the channel region may comprise a shallow channel contact region 1022 of the second conductivity type with an increased dopant concentration compared to the remaining portions of the channel region 102, e.g., increased by a factor of at least ten.

Further, within the mesas 17, 18, the drift region 100 may exhibit an increased dopant concentration, e.g., increased by a factor of at least ten compared to the portion of the drift region 100 below the trench bottoms 145, 155, 165. For example, the portion of the drift region 100 that extends into the mesas 17, 18 and that exhibits said increased dopant concentration may form the pn-junction 1021 with the channel region 102 and may be referred to as barrier region 103.

At shall be understood that the barrier region 103, e.g., as schematically and exemplarily illustrated in FIG. 20, may also be implemented in the other embodiments described herein.

Figure 22A:
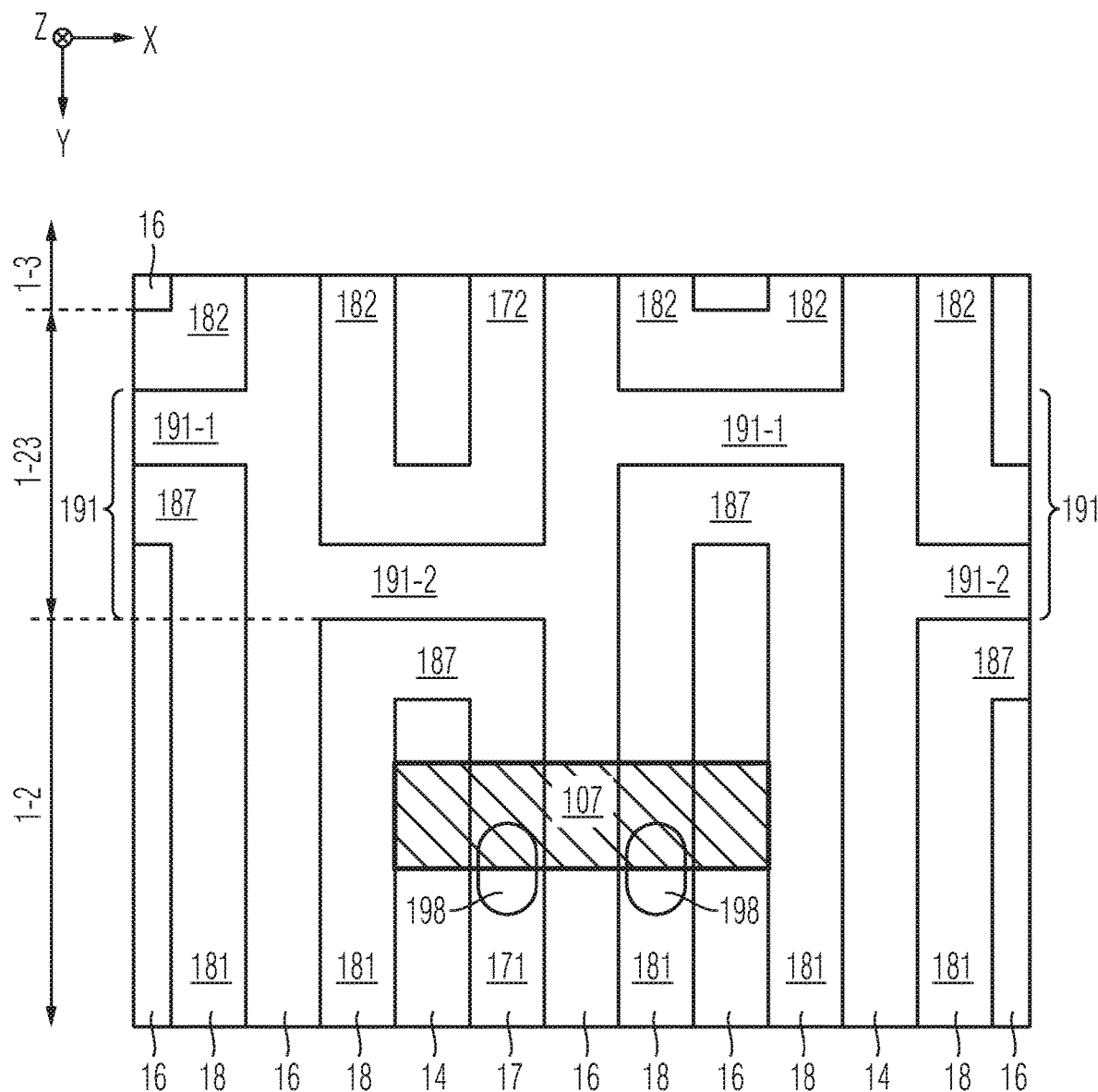
FIGS. 22A-22B each schematically and exemplarily illustrate a section of a horizontal projection of a power semiconductor device in accordance with one or more embodiments.
Figure 22B:
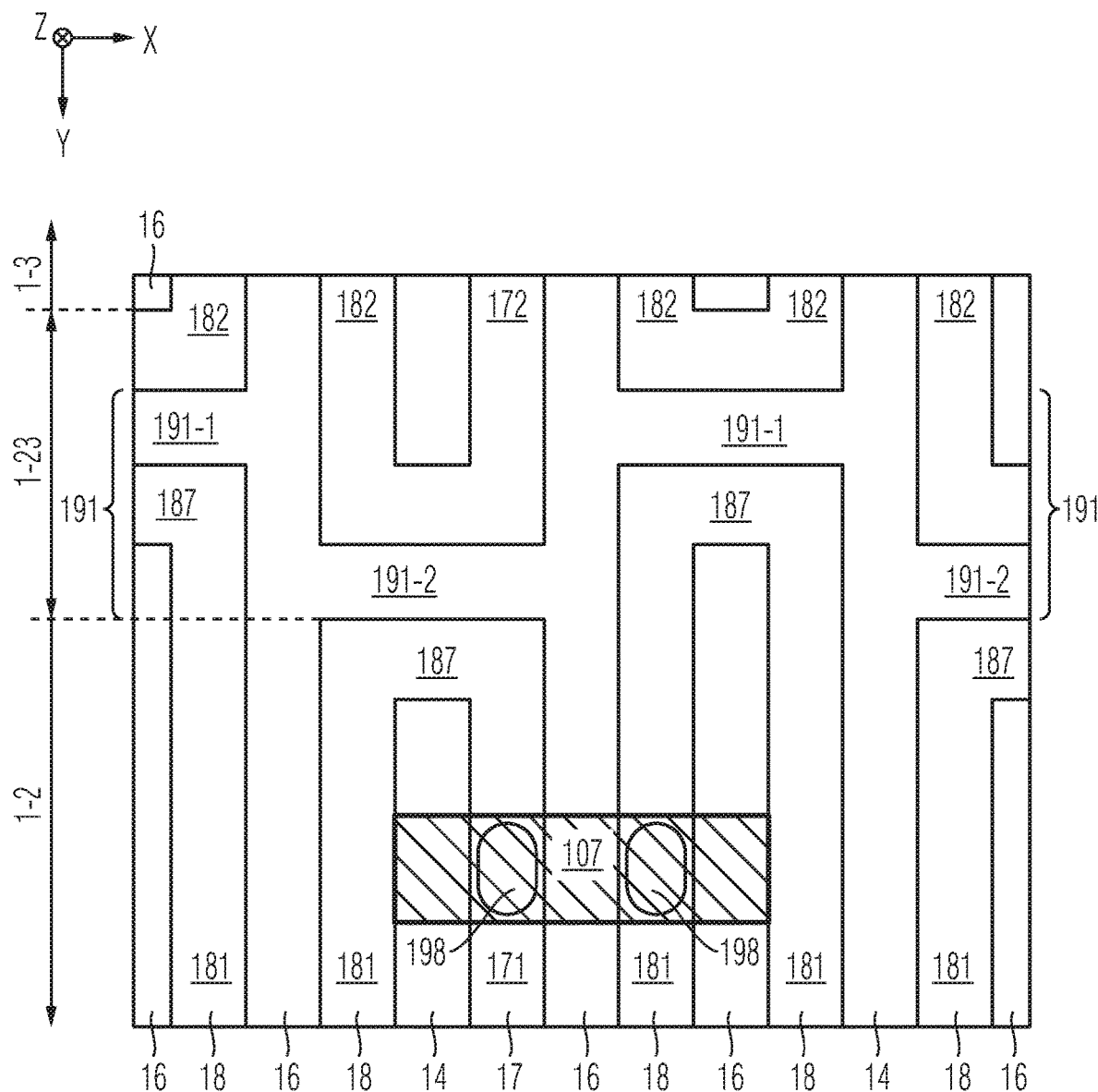

Now referring to FIGS. 22A-22B, adjacent to the one or more columnar trenches 198 and within the respective mesa, a doped region 107 of the first conductivity type may be provided. For example, the doped region 107 has a dopant concentration significantly higher than the drift region dopant concentration, e.g., at least ten times as high. The doped region 107 can be arranged adjacent to the one or more columnar trenches. E.g., the doped region 107 is only locally provided, namely at locations where the one or more columnar trenches 198 are positioned. For example, the doped region 107 entirely horizontally surrounds the one or more columnar trenches 198, as illustrated in FIG. 22B, or is arranged adjacent to the one or more columnar trenches 198 only on the side facing to the cross-trench section(s) 187, as illustrated in FIG. 22A. E.g., the doped region 107 has a total extension in the second lateral direction Y of no more than 1 µm. In the vertical direction Z, the total extension of the doped region 107 may correspond to the depth of the source region 101, for example.

Figure 23A:
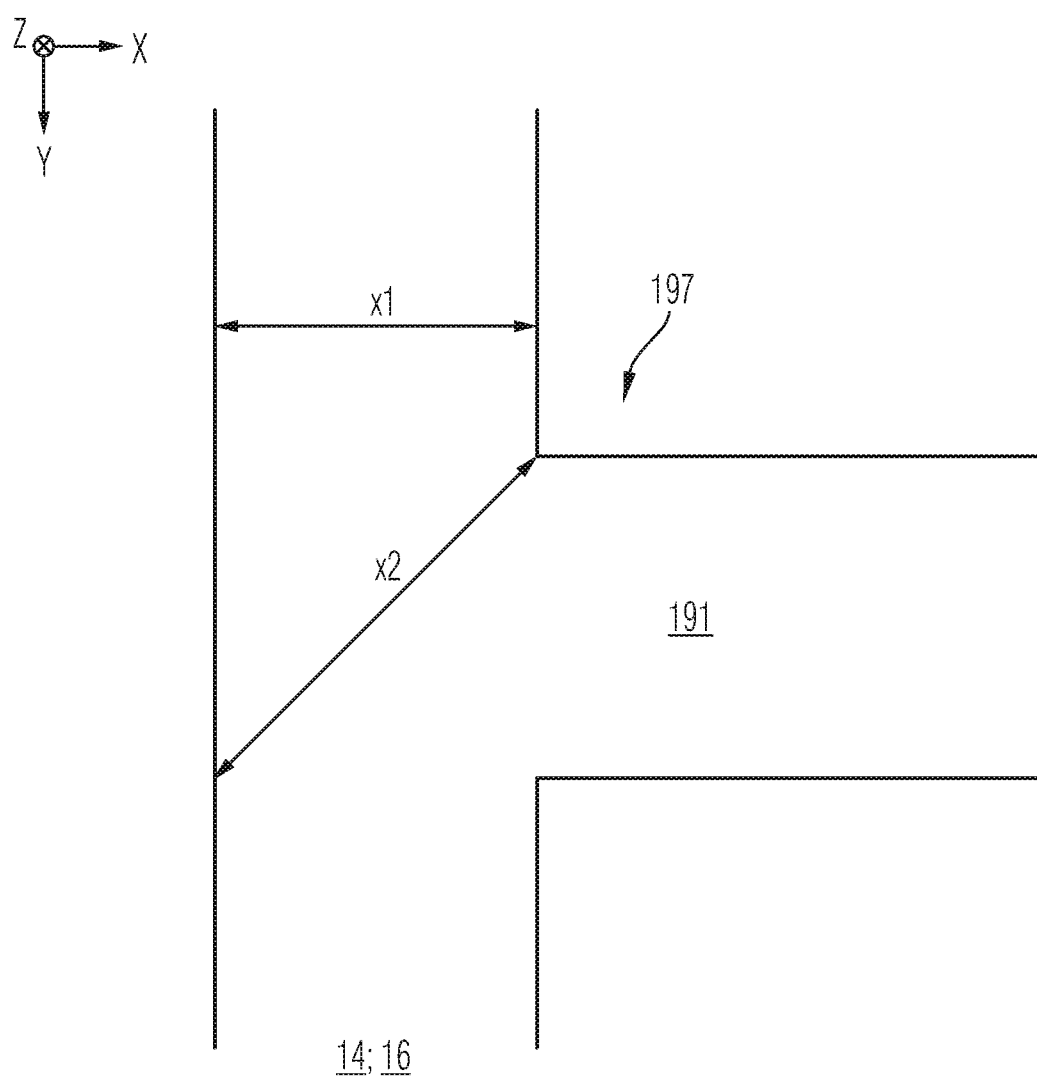
FIGS. 23A, 23B, and 23C each schematically and exemplarily illustrate a section of a horizontal projection of a power semiconductor device in accordance with one or more embodiments.
Figure 23B:
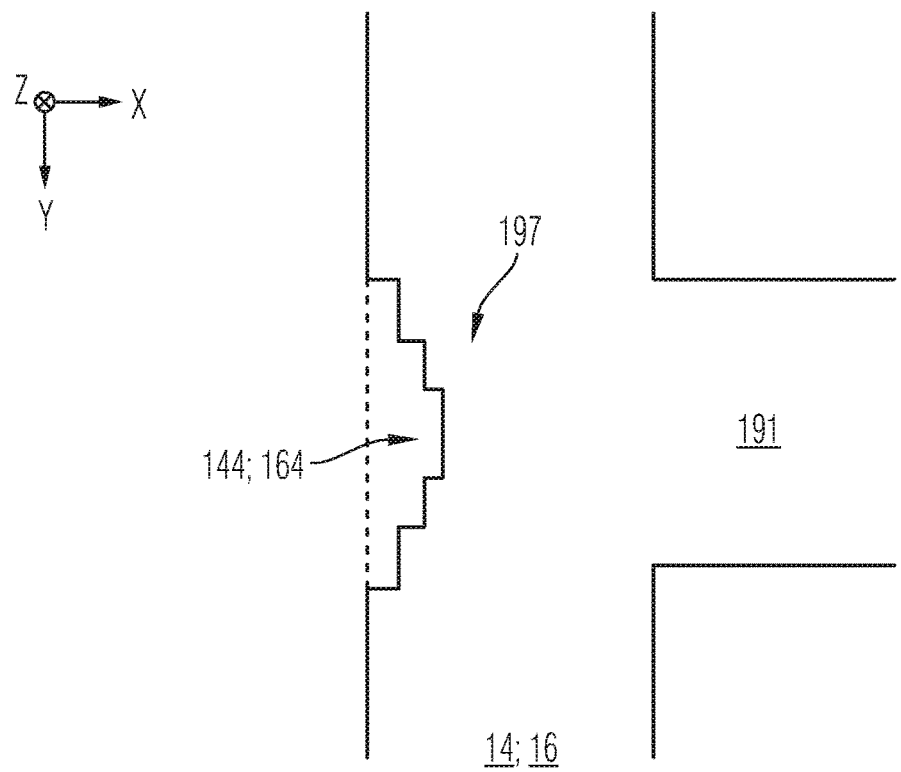
Figure 23C:
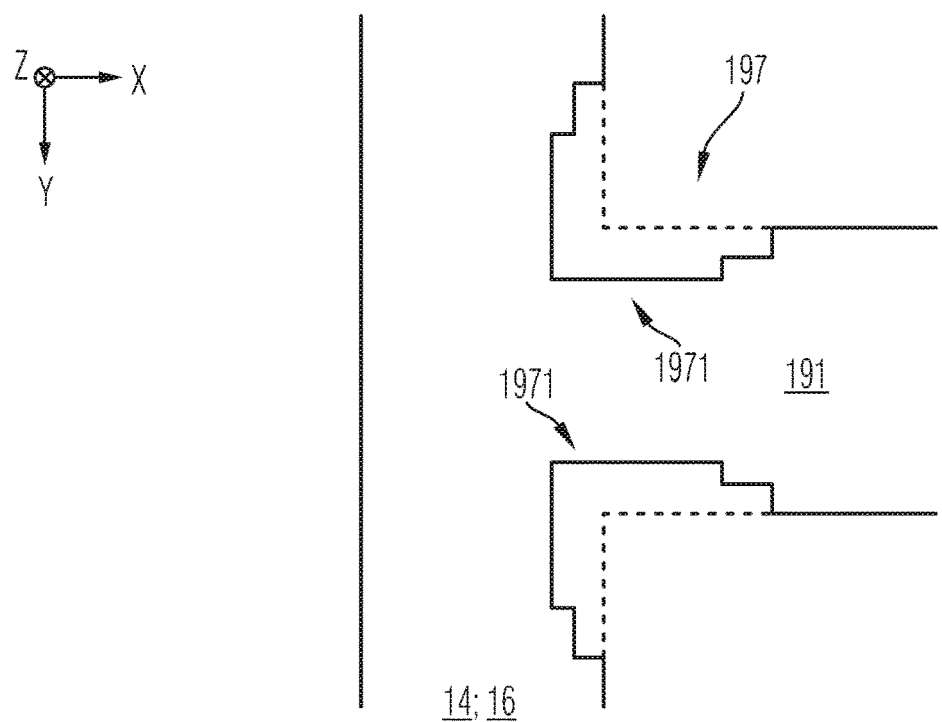

Now referring to FIGS. 23A, 23B, and 23C, the cross-trench arrangement 191 may form a T-junction 197 with another trench, e.g., with the first type trench 14 or the second type trench 16. As shown in the other drawings, many of such T-junctions 197 can be formed along the lateral extension of the cross-trench arrangement 191, cf. for example FIGS. 10-15.

It shall be understood that the cross-trench arrangement 191 may interrupt one or more of the trenches 14, 15, 16, or may only abut with one or more of the trenches 14, 15, 16, i.e., without interrupting the trenches. In either case, said T-junctions 197 may be formed.

As illustrated in FIG. 23A, the T-junction 197 may exhibit a greater horizontal cross-sectional area (locally larger open area), indicated by distance x2, as compared to the cross-trench arrangement 191 and the intersecting trench (which may be the first type trench 14, for example), indicated by distance x1. Hence, depending on the process flow, the depth of the T-junction 197 in the vertical direction Z may be greater than the depth of the cross-trench arrangement 191 and the intersecting trench (which may be the first type trench 14, for example). E.g., such depth variation may occur if an etching processing step is carrier out in accordance with the layout illustrated in FIG. 23A.

For example, a depth of the T-junction 197 (along the vertical direction) is smaller than 105% of the depth of the intersecting trench, said depth being present in the active region 1-2. In other words, it is ensured, e.g., by means of the at one or more trench taper sections 1971, that a local trench depth variation present at the T-junction 197, i.e., between the cross-trench arrangement 191 and the intersecting trench is less than 5%.

In an embodiment, the T-junction 197 comprises one or more trench taper sections 1971. The one or more trench taper section 1971 can be configured to reduce the horizontal cross-sectional area of the T-junction 197.

For example, referring to FIG. 23B, the trench taper section 1971 can be formed at the sidewall 144; 164 of the intersecting trench 14; 16, e.g., at a portion that laterally overlaps with the cross-trench arrangement 191 along the second lateral direction Y. E.g., in said portion, the trench sidewall 144; 164 exhibits a step profile pointing towards the cross-trench arrangement 191. In another embodiment (not illustrated), the trench taper section 1971 can exhibit a bulge like form pointing towards the cross-trench arrangement 191.

In another embodiment, as shown in FIG. 23C and which can be combined with the embodiment of FIG. 23B, trench taper section 1971 can be formed at one or both of the corners of the T-junction 197. E.g., the corners can be rounded or be formed with a step profile so as to reduce the horizontal cross-sectional area of the T-junction 197.

E.g., the trench taper sections 1971 (e.g., the steps as illustrated in FIGS. 23B-23C) extend away from the respective sidewall of the intersecting trench 14; 16 (FIG. 23B) and/or the cross-trench arrangement 191 (FIG. 23C) by at least 20 nm, at least 100 nm or at least 200 nm.

As will become more apparent from FIG. 24 described further below, the term T-junction also encompasses variants in which the cross-trench arrangement 191 and the intersecting trench form a Y-like intersection. E.g., in the embodiment illustrated in FIG. 24, left and right to the central portion including the two first type mesas 17, respective two second type mesas 18 are separated into said first sections 181 and second sections 182 by means of the decoupling structure 19 including the cross-trench arrangements 191. For example, three trenches of the first, second or third type (referred to as 14; 15; 16) laterally confine two second type mesas 18 in the active region 1-2. Within the transition region 1-23, three trenches of the first, second or third type (referred to as 14; 15; 16) merge or, respectively, abut to the cross-trench arrangement 191. As illustrated, two of the three trenches of the first, second or third type (referred to as 14; 15; 16) intersect with the cross-trench arrangement in a Y-like formation.

Further, it shall be understood that the mesas 17, 18 and the trenches 14, 15, 16 must not necessarily extend into the termination region 1-3; rather, the termination region 1-3 may be structured in a different manner compared to the trench-mesa-pattern present in the active region 1-2. E.g., as can be seen in FIG. 24, the trench-pattern in the termination region 1-3 may differ from the trench pattern in the active region 1-2. For example, the trench-pattern is changed in the transition region 1-23, i.e., in the region where also the decoupling structure (e.g., the cross-trench arrangement(s) 191) may be positioned.

Figure 24:
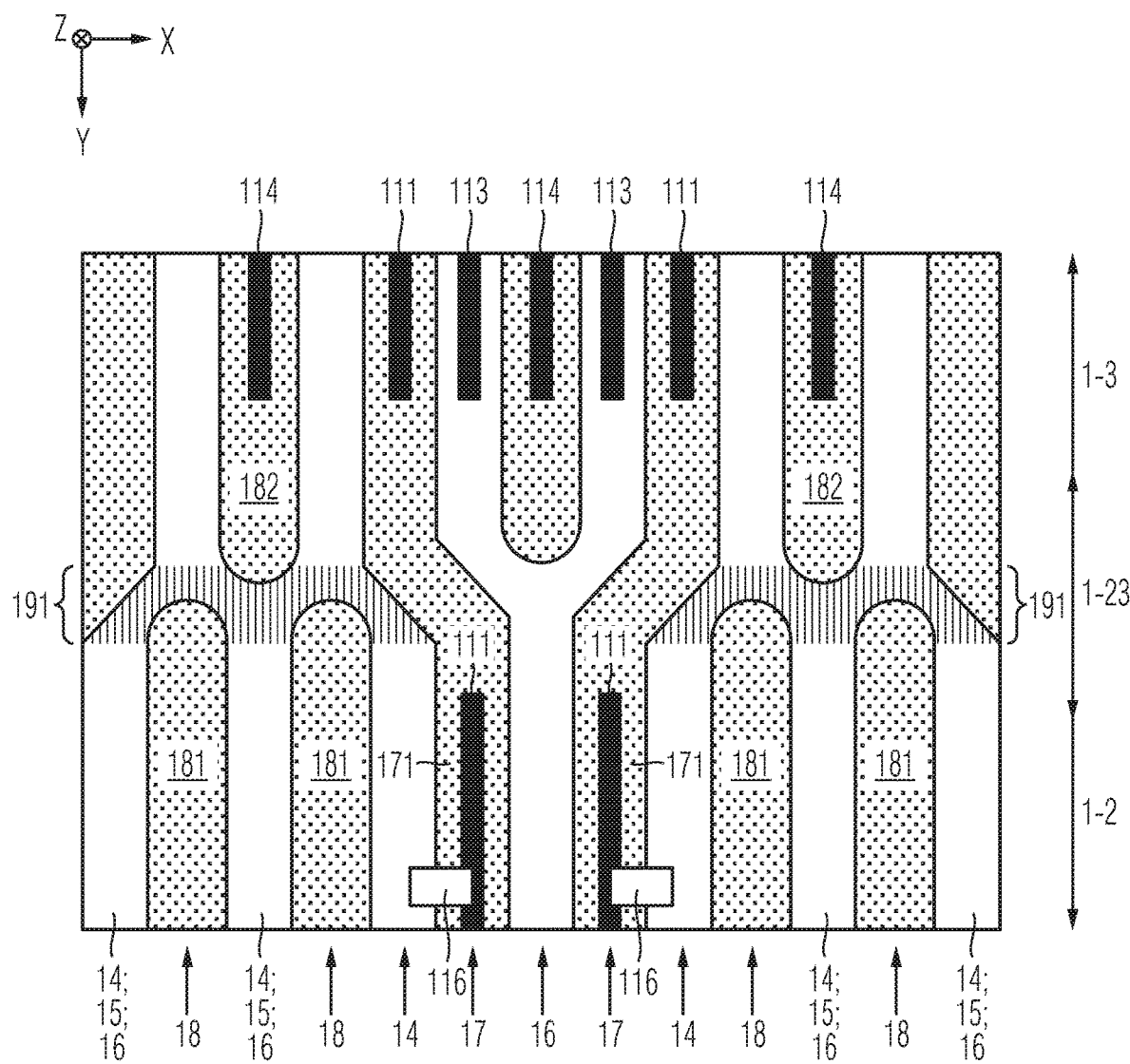
FIG. 24 schematically and exemplarily illustrates a section of a horizontal projection of a power semiconductor device in accordance with one or more embodiments.

Still referring to FIG. 24, which schematically and exemplarily illustrates a section of a horizontal projection of an embodiment of the power semiconductor device 1, the first section 181 of the second type mesa 18 formed at least by the semiconductor body 10 in the active region 1-2 and the second section 182 of the second type mesa 18 formed at least by the semiconductor body 10 in the termination region 1-3 are laterally displaced from each other along the first lateral direction X.

For example, the decoupling structure 19 (e.g., implemented as cross-trench arrangement 191) may be arranged within the second type mesa 18 and may separate the second type mesa 18 into sections 181 and 182 by terminating, in the second lateral direction Y, the first section(s) 181, as illustrated in FIG. 24. For example, along the first lateral direction X, the first section 181 does not laterally overlap with the second section 182. E.g., the first section 181 and the second section 182 can be laterally displaced along the first lateral direction X by approximately (or exactly) one trench width, e.g., by the width of one source trench 16.

Figure 18:
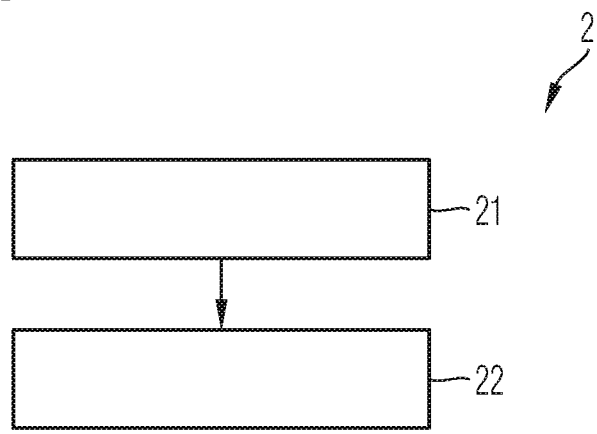
FIG. 18 schematically and exemplarily illustrates a method in accordance with one or more embodiments.

Regarding finally the method 2 schematically and exemplarily illustrated in FIG. 18, it shall be understood that method 2 may be implemented in various embodiments, e.g., in embodiments corresponding to the exemplary embodiments of the power semiconductor device 1 that have been explained with respect to the preceding drawings. In so far, it is referred to the above. Generally, method 2 may comprise a first step 21 in which a power semiconductor device provided that comprises: an active region configured to conduct a load current; an inactive termination region surrounding the active region; a semiconductor body that forms a part of each of the active region and the inactive termination region; a first load terminal and a second load terminal, wherein the active region is configured to conduct the load current between first load terminal and the second load terminal; a control terminal configured to receive a control signal for controlling the load current; and at least one power cell with a plurality of trenches extending into the semiconductor body and arranged adjacent to each other along a first lateral direction. Each of the plurality of trenches includes a trench electrode. Each of the trenches has a stripe configuration that extends along a second lateral direction into the active region. The plurality of trenches of each of the at least one power cell comprises at least one first type trench whose trench electrode is electrically connected to the control terminal, and at least one second type trench whose trench electrode is either electrically connected to an electrical potential different from the electrical potential of the control terminal or electrically floating. The trenches spatially confine a plurality of mesas. The plurality of mesas comprise at least one first type mesa electrically connected to the first load terminal within the active region and being configured to conduct at least a part of the load current, and at least one second type mesa configured to not conduct the load current. Method 2 may further comprise a second step 22 in which a decoupling structure is provided that is arranged within at least one of said at least one second type mesa and that separates the at least one second type mesa into a first section formed at least by the semiconductor body in the active region and into a second section formed at least by the semiconductor body in the termination region.

In the above, embodiments pertaining to power semiconductor devices and corresponding processing methods were explained. For example, these semiconductor devices are based on silicon (Si). Accordingly, a monocrystalline semiconductor region or layer, e.g., the semiconductor body 10 and its regions/zones, e.g., regions 100, 101, 102, 109, 108, 181, 182, 171, 172 etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor switch, comprising:
    a first load terminal and a second load terminal, the power semiconductor switch being configured to conduct a load current along a vertical direction between the first and the second load terminals;
    an active cell region with a drift region of a first conductivity type;
    an edge termination region having a well region of a second conductivity type electrically connected to the first load terminal; and
    a plurality of IGBT cells arranged within the active cell region, each of the IGBT cells comprising a plurality of trenches that extend into the drift region along the vertical direction and that laterally confine a plurality of mesas,
    wherein the plurality of trenches comprises:
        at least one control trench having a control electrode for controlling the load current;
        at least one dummy trench having a dummy electrode electrically coupled to the control electrode; and
        at least one further trench having a further trench electrode, the at least one further trench being one of a further control trench and a further dummy trench;
    wherein the plurality of mesas comprises:
        at least one active mesa electrically connected to the first load terminal within the active cell region and being configured to conduct at least a part of the load current, each of the number of control trenches that are included in the respective IGBT cell being arranged adjacent to no more than one active mesa; and
        at least one inactive mesa arranged adjacent to the at least one dummy trench and not electrically connected to the first load terminal; and
    a cross-trench structure associated with at least one of the IGBT cells, the cross-trench structure merging each of the at least one control trench, the at least one dummy trench and the at least one further trench of the at least one IGBT cell to each other, the cross-trench structure overlapping at least partially along the vertical direction with the plurality of the trenches of the at least one IGBT cell.

2. The power semiconductor switch of claim 1, further comprising at least one source trench having a source electrode electrically connected with the first load terminal.

3. The power semiconductor switch of claim 1, wherein the cross-trench structure separates the at least one active mesa and the at least one inactive mesa each into a first section in the active cell region and a second section formed in the edge termination region which surrounds the active cell region.

4. The power semiconductor switch of claim 3, wherein the cross-trench structure is arranged within a transition region between the active cell region and the edge termination region.

5. The power semiconductor switch of claim 3, wherein the first section of the at least one active mesa and the first section of the at least one inactive mesa are connected to each other by a cross-mesa section adjacent to the cross-trench structure.

6. The power semiconductor switch of claim 5, wherein the cross-mesa section is formed by a portion of a semiconductor body that includes the active cell region and the edge termination region.

7. The power semiconductor switch of claim 5, wherein the cross-mesa section is interrupted by a portion of a decoupling structure of the cross-trench structure, and/or by one or more spacer trench sections, and/or one by or more columnar trenches.

8. The power semiconductor switch of claim 7, wherein the decoupling structure decouples the at least one active mesa from the at least one inactive mesa.

9. The power semiconductor switch of claim 3, wherein the cross-trench structure comprises a decoupling structure having spacer trench sections formed by local trench widenings, and wherein the local trench widenings are configured and positioned so as to electrically decouple the first section of the at least one active mesa and first section of the at least one inactive mesa from each other.

10. The power semiconductor switch of claim 3, wherein the first section of the at least one inactive mesa is electrically floating, and wherein the first section of the at least one active mesa has a same electrical potential as the first load terminal.

11. The power semiconductor switch of claim 1, wherein the cross-trench structure forms a T junction with the at least one control trench and the at least one dummy trench.

12. The power semiconductor switch of claim 1, wherein the cross-trench structure comprises an insulating material that extends between sidewalls and down to a bottom of the at least one control trench and the at least one dummy trench.

13. The power semiconductor switch of claim 1, wherein the cross-trench arrangement comprises a cross-trench electrode.

14. The power semiconductor switch of claim 13, wherein the cross-trench electrode is electrically connected to the control electrode of the at least one control trench.

15. The power semiconductor switch of claim 13, wherein the cross-trench electrode is electrically insulated from the dummy electrode of the at least one dummy trench.

16. The power semiconductor switch of claim 1, wherein the cross-trench structure extends through the at least one active mesa along a lateral direction.

* * * * *

UNITED STATES PATENT AND TRADEMARK OFFICE
CERTIFICATE OF CORRECTION

| | | |
|---|---|---|
| PATENT NO. | : 11,610,986 B2 | Page 1 of 1 |
| APPLICATION NO. | : 17/350505 | |
| DATED | : March 21, 2023 | |
| INVENTOR(S) | : M. Dainese et al. | |

It is certified that error appears in the above-identified patent and that said Letters Patent is hereby corrected as shown below:

In the Claims

Column 28, Line 56 (Claim 7, Line 4) please change "one by or" to -- by one or --

Signed and Sealed this
Ninth Day of May, 2023

Katherine Kelly Vidal
*Director of the United States Patent and Trademark Office*